(12) United States Patent
Morning-Smith et al.

(10) Patent No.: US 9,740,258 B2
(45) Date of Patent: Aug. 22, 2017

(54) HOLD-UP ENERGY STORAGE AND MANAGEMENT

(71) Applicant: Intel Corporation, Santa Clara, CA (US)

(72) Inventors: Andrew Morning-Smith, Vancouver (CA); Mike M. Ngo, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 303 days.

(21) Appl. No.: 14/223,439

(22) Filed: Mar. 24, 2014

(65) Prior Publication Data

US 2015/0268709 A1    Sep. 24, 2015

(51) Int. Cl.
| | | |
|---|---|---|
| H02J 1/10 | (2006.01) | |
| H02J 3/38 | (2006.01) | |
| H02J 9/00 | (2006.01) | |
| G06F 1/28 | (2006.01) | |
| H02J 9/06 | (2006.01) | |
| H02J 7/00 | (2006.01) | |
| G01R 31/02 | (2006.01) | |
| G08B 29/18 | (2006.01) | |
| G06F 1/30 | (2006.01) | |
| H02J 7/34 | (2006.01) | |

(52) U.S. Cl.
CPC ............. *G06F 1/28* (2013.01); *G01R 31/028* (2013.01); *G06F 1/30* (2013.01); *G08B 29/18* (2013.01); *H02J 7/0063* (2013.01); *H02J 9/061* (2013.01); *H02J 7/345* (2013.01); *Y10T 307/344* (2015.04); *Y10T 307/615* (2015.04)

(58) Field of Classification Search
CPC ... G08B 29/181; G08B 29/18; B60L 11/1861; B60L 11/1881; B60L 11/18; B60L 11/16; G05F 1/66; G05B 17/02; H02J 7/00
USPC ...... 340/636.11, 636.21; 307/23, 66, 43, 64, 307/80; 320/109, 104, 103; 365/229, 365/222; 700/295, 291, 297; 429/9, 7; 361/528, 527, 500
See application file for complete search history.

(56) References Cited

U.S. PATENT DOCUMENTS

| | | | | |
|---|---|---|---|---|
| 4,894,601 A | * | 1/1990 | Watkins | ................. G08B 29/12 250/342 |
| 5,229,649 A | * | 7/1993 | Nielsen | ................. A01G 25/16 250/206 |
| 7,791,348 B2 | * | 9/2010 | Brown | .................. G06Q 30/02 320/104 |
| 2005/0001627 A1 | * | 1/2005 | Anbuky | ............. G01R 31/3651 324/427 |
| 2005/0040789 A1 | * | 2/2005 | Salasoo | ................ H02J 7/0014 320/119 |
| 2009/0027056 A1 | * | 1/2009 | Huang | ................ B60L 11/1857 324/439 |

(Continued)

*Primary Examiner* — Rexford Barnie
*Assistant Examiner* — Jagdeep Dhillon
(74) *Attorney, Agent, or Firm* — Compass IP Law PC

(57) ABSTRACT

Power management circuitry initiates storage of backup energy in an energy storage resource. The backup energy is stored to power an electronic circuitry during a power failure condition in which primary power is unavailable to power the electronic circuit. During a test mode, the power management circuitry selectively discharges the backup energy stored in the energy storage resource at multiple different energy discharge rates to test the energy storage resource.

32 Claims, 13 Drawing Sheets

(56) References Cited

U.S. PATENT DOCUMENTS

| | | | | |
|---|---|---|---|---|
| 2009/0168305 A1* | 7/2009 | Fleig | ............... | H01G 9/016 361/528 |
| 2010/0035093 A1* | 2/2010 | Ruoff | ............... | H01G 11/36 429/493 |
| 2010/0121587 A1* | 5/2010 | Vian | ............... | G01R 31/3651 702/63 |
| 2010/0226194 A1* | 9/2010 | Huang | ............... | G11C 16/22 365/229 |
| 2011/0082598 A1* | 4/2011 | Boretto | ............... | G06Q 10/06 700/291 |
| 2011/0121654 A1* | 5/2011 | Recker | ............... | H02J 9/065 307/66 |
| 2011/0320056 A1* | 12/2011 | Brown | ............... | B60L 3/0069 700/295 |
| 2012/0116696 A1* | 5/2012 | Wank | ............... | G01R 31/42 702/58 |
| 2013/0135110 A1* | 5/2013 | Xie | ............... | G08B 29/181 340/636.11 |
| 2013/0266826 A1* | 10/2013 | Cowperthwaite | ............... | H01G 9/28 429/7 |
| 2014/0136001 A1* | 5/2014 | Gutierrez | ............... | H02J 3/32 700/286 |
| 2015/0112497 A1* | 4/2015 | Steven | ............... | G06Q 50/06 700/291 |

* cited by examiner

HOLD-UP ENERGY STORAGE AND MANAGEMENT

BACKGROUND

Computer systems typically include one or more different types of resources to store data. Examples of data storage resources include hard drives, optical disks, non-volatile memory chips, volatile memory chips, etc.

In certain instances, access to data in a storage resource in a computer system requires that the corresponding storage resource be powered. For example, in order to write data to or read data from a non-volatile memory chip, the non-volatile memory chip must be powered.

It is known that computer systems and corresponding data storage resources are susceptible to power outages. For example, a primary power source used to power a respective computer may fail at any time. Attempts to access a non-volatile memory chip during a power failure condition may result in corruption of stored data. Computer systems typically include volatile memory resources such as cache or Dynamic RAM (Random Access Memory) to store often-accessed data. In certain instances, the computer system also includes non-volatile memory to store important data that is to be retained even during shut down of the computer system. If data in the volatile memory device is not stored to a non-volatile memory device prior to shut down of the computer system, the data will be lost.

To avoid corruption or loss of data as a result of a power failure, computer systems typically include a bank of capacitors to store holdup energy. When a power failure condition is detected, a power supply in the computer system reverts to using the holdup energy stored in the bank of capacitors (instead of using main power because it is no longer available) to continue to power the computer system during the power failure so that any final writes of data to the non-volatile memory can occur.

Certain conventional power supply systems implement a test to determine a health of a respective bank of capacitors used to store the holdup energy prior to the occurrence of a power failure. For example, one type of conventional power supply system performs a respective energy storage test by electrically coupling an output of the bank of capacitors to a known load for a short duration of time. The monitor circuit monitors a rate at which energy stored in the bank of capacitors is discharged through the known load. Based on the monitoring and the rate at which the output voltage of the capacitors decays over time, the conventional power supply system estimates how much energy is stored in the capacitors.

DESCRIPTION OF THE EMBODIMENTS

Figure 1:
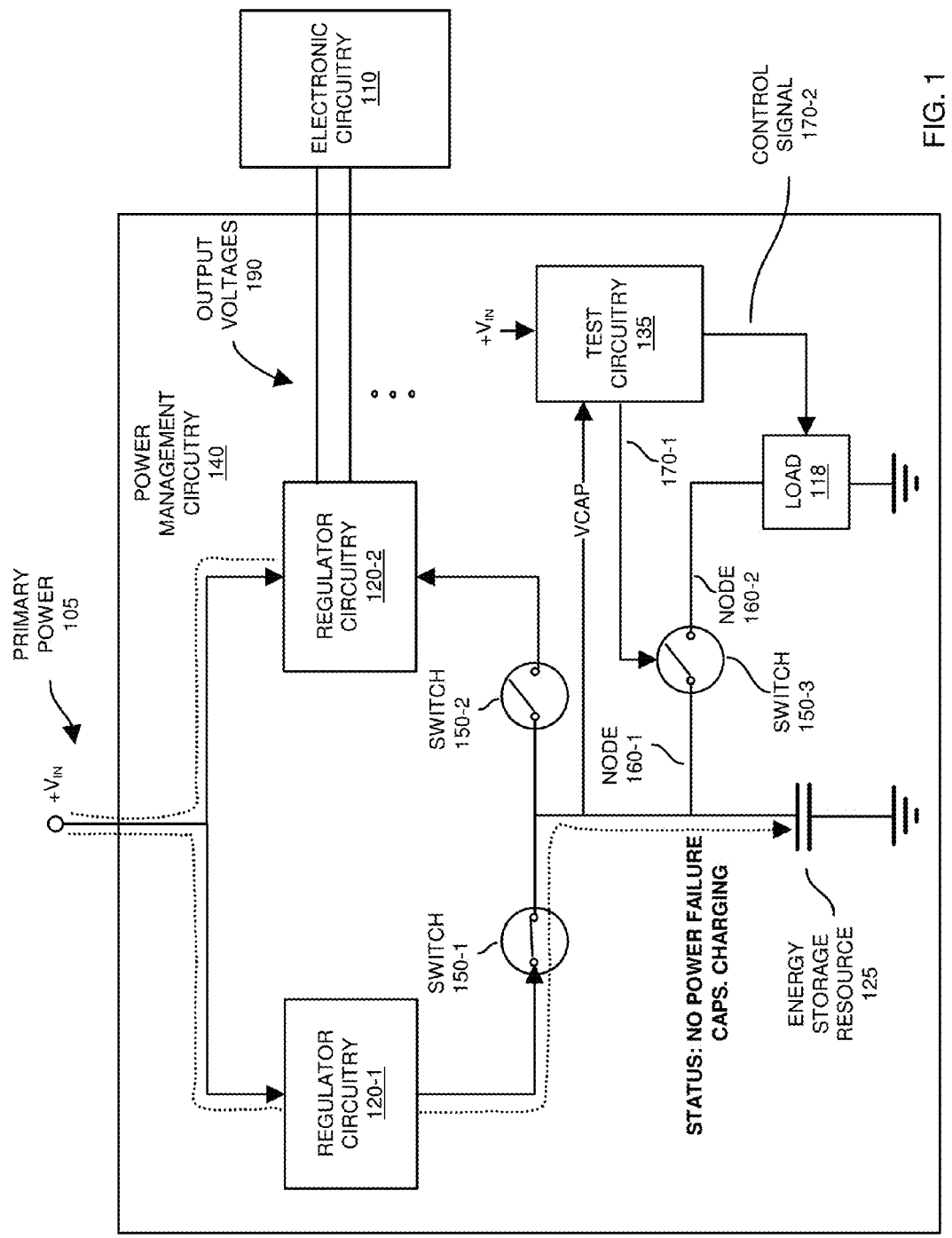
FIG. 1 is an example diagram illustrating operation of power management circuitry and charging of an energy storage resource according to embodiments herein.

This disclosure includes the observation that conventional techniques of testing the ability of a respective capacitor bank to store holdup energy suffer from a number of deficiencies.

For example, as discussed above, an energy holdup circuit can be used to provide electronic circuitry protection against power loss. The energy holdup circuit stores reserve energy in one or more capacitors. During a power failure, when primary power is no longer available, voltage regulators in a respective power supply use the energy in the bank of holdup capacitors to provide continued power to a respective electronic circuit after the power failure has occurred.

Since holdup capacitors add cost to a system as well as consume significant space (real estate) on a respective circuit board, it is often impractical to significantly over provision the capacitor/energy storage so only slightly more capacitance than the required amount is provided. In other words, designing a circuit to include one or more extra (and unneeded) capacitors to ensure proper holdup during a power failure is undesirable because it substantially increases the size and cost of a corresponding system.

This disclosure further includes the observation that as a bank of capacitors ages, the capacitors degrade. For example, the amount of effective available capacitance to store energy can decrease substantially over time as a result of increasing leakage current. Additionally, as a capacitor ages, the equivalent series resistance (output impedance) of the capacitor may increase. Both of these types of degradations reduce the amount of energy in the capacitor that can be used by a voltage regulator to power a respective mode during a power failure condition.

In accordance with a conventional holdup capacitor test, the holdup capacitor is disconnected from its charging circuit and the output of the charged capacitor bank is temporarily connected to a fixed internal load such as a 100 mA (milliAmp) load to measure the amount of energy available in the holdup capacitor.

In contrast to conventional techniques of measuring available energy in a capacitor bank using a single discharge rate test of discharging the holdup energy into a known load, embodiments herein include testing the discharge of energy at different discharge rates. More specifically, according to embodiments herein, a power management circuit initiates storage of energy in an energy storage resource such as a capacitor bank. The energy storage resource stores backup energy to power electronic circuitry during a power failure condition in which primary power is unavailable to power the electronic circuitry. During a normal operational mode when there is no power failure, the power management circuitry selectively discharges the backup energy stored in the energy storage resource at different energy discharge rates to test the energy storage resource.

As further described herein, selectively discharging the backup energy at different discharge test rates enables respective power management circuitry to more precisely calculate an amount of available holdup energy that can be used to power a respective load during a power failure condition. For example, testing at different discharge rates (using different loads) enables the respective power management circuitry to identify an amount of leakage current (and leakage energy) associated with the bank of capacitors. As its name suggests, leakage current represents current outputted from the bank of capacitors that is not delivered to (or is not available to) power a corresponding load such as a computer system. In contrast to conventional techniques, embodiments herein take into account the leakage current when calculating a value representative of an amount of usable energy stored in the bank of capacitors to hold up voltage outputted to the electronic circuit.

Additionally, selectively discharging the backup energy at different discharge rates enables respective power management circuitry to more precisely calculate an equivalent series resistance value associated with the bank of capacitors. Ideally, a capacitor can be modeled as a capacitor in series with a resistor, which represents a respective equivalent series resistance associated with the capacitor. A higher equivalent series resistance of the bank of capacitors results in a smaller portion of energy in the bank of capacitors that can be used as holdup energy to power a respective electronic circuit during the power failure condition. In other words, a portion of energy outputted from the capacitor bank is dissipated in the equivalent series resistance as opposed to being dissipated in a respective load. In contrast to conventional techniques, embodiments herein take into account the equivalent series resistance of a respective capacitor bank resource when calculating a value representative of an amount of usable energy stored in the bank of capacitors to hold up electronic circuit.

More accurate calculations of the available energy in a bank of capacitors (by taking into account calculated leakage current, equivalent series resistance, etc.) can be used to beneficially reduce the size of the bank of capacitors that are required to be installed on a respective circuit board. In other words, it is not required to oversize a respective capacitor bank installed on a circuit board. The unused space on the circuit board can then be used for other circuitry.

Now, more specifically, FIG. 1 is an example diagram illustrating power management circuitry according to embodiments herein.

As shown, power management circuitry 140 receives primary power (voltage Vin) that is used to provide power to electronic circuitry 110 (such as a solid-state drive). Power management circuitry 140 includes one or more voltage regulators such as regulator circuitry 120-1, regulator circuitry 120-2, etc.

During normal operation, when there is no power failure associated with primary power 105 (when a voltage magnitude of Vin resides in a tolerable range such as between 4.8 and 5.5 volts), the regulator circuitry 120-2 such as a DC-DC buck and/or boost converter converts the primary power 105 (received as input voltage, Vin) to one or more output voltages 190. Regulator circuitry 120-2 can include any suitable circuitry to convert the input voltage V into a respective output voltage supplied to power electronic circuitry 110. The output voltages 190 can include one or more voltage rails supplying one or more different voltages to electronic circuitry 110.

In this example embodiment, power management circuitry 140 includes test circuitry 135 and corresponding components to holdup the power supplied (one or more output voltages 190) to electronic circuitry 110 for at least a short duration of time during a power failure condition in which primary power 105 is no longer provided to power management circuitry 140. As previously discussed, supplying continued power to electronic circuitry 110 during a power failure condition enables the electronic circuitry 110 to perform final operations prior to the backup power being used up.

More specifically, as shown, power management circuitry 140 can include regulator circuitry 120-1 such as a DC-DC boost converter. To store backup energy in the energy storage resource 125 (such as capacitor resource including one or more capacitors), the power management circuitry 140 controls switch 150-1 to an ON position such that the boosted voltage generated by regulator circuitry 120-1 charges energy storage resource 125. Note that switches 150 are shown by way of non-limiting example only. The power management circuitry 140 can be implemented in any suitable manner to control a flow of current into and out of energy storage resource 125. For example, in lieu of opening switch 150-1, embodiments herein can include shutting OFF regulator circuitry 120-1 to discontinue charging the energy storage resource 125. Regulator circuitry 120-2 can control drawing of current from primary power 105 or energy storage resource 125.

At times when the voltage regulator circuitry 120-2 uses the input voltage Vin to produce output voltages 190, the power management circuitry 140 controls switch 150-2 to an OPEN position. However, power management circuitry 140 monitors the magnitude of voltage Vin to determine when to switch over and use energy stored in energy storage resource 125 to produce one or more output voltages 190. For example, when a power failure with respect to primary power 105 is detected, such as when the voltage Vin drops below a threshold value such as 4.5 volts DC, the power management circuitry 140 controls switch 150-1 to an OFF state and controls switch 150-2 to an ON state. This is more particularly shown in FIG. 2.

Figure 2:
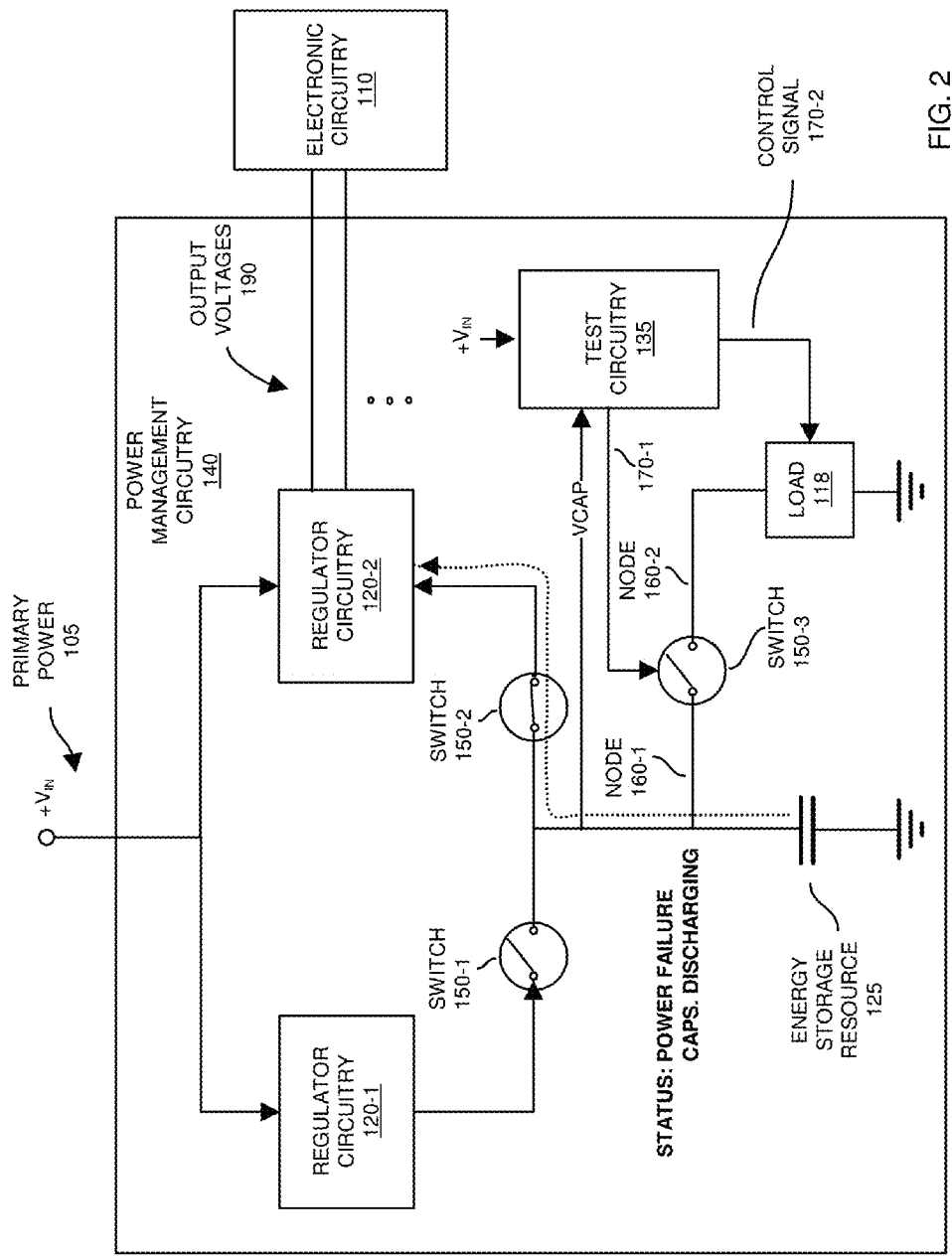
FIG. 2 is an example diagram illustrating operation of power management circuitry and discharging of energy storage resource during a power failure according to embodiments herein.

At such time, as shown in FIG. 2, during the power failure condition when power 105 is no longer available, the regulator circuitry 120-2 uses the backup energy stored in energy storage resource 125 in order to continue producing one or more output voltages 190 to provide continued, uninterrupted power to electronic circuitry 110.

As previously discussed, the amount of energy stored in energy storage resource 125 is limited. Thus, during the power failure when primary power 105 is no longer sufficient for regulator circuitry 120-2 to produce output voltages 190, the power management circuitry 140 utilizes the backup energy stored in the energy storage resource 125 to holdup one or more output voltages 190 for any suitable amount of time after the power failure first occurs. By way of non-limiting example, in one embodiment, the energy storage resource 125 includes a sufficient amount of capacitance such that regulator circuitry 120-2 is able to holdup producing the one or more output voltages 190 for a predetermined amount of time such as more than 10 milliseconds although the holdup time can be any suitable value.

When energy storage resource 125 is a larger capacitance, the energy storage resource 125 stores more backup energy and supports holding up one or more output voltages 190 for a longer amount of time. Conversely, when energy storage resource 125 is a smaller capacitance, the energy storage resource 125 stores less backup energy and supports holding up one or more output voltages 190 for a shorter amount of time.

Referring again to FIG. 1, power management circuitry 140 includes test circuitry 135. As its name suggests, test circuitry 135 tests an ability of energy storage resource 125 to store backup energy for use during a power failure condition in which primary power 105 is unavailable for use by regulator circuitry 120-2 to produce one or more output voltages 190 and power the electronic circuitry 110. As further discussed herein, during a respective test mode, the power management circuitry 140 selectively discharges the backup energy stored in the energy storage resource 125 at multiple different energy discharge rates to test the energy storage resource 125.

To test the energy storage resource 125 at different discharge rates, the power management circuitry 140 includes test circuitry 135 and related components. In one embodiment, test circuitry 135 produces control signal 170-2 to configure load 118. As further discussed herein, load 118 can be varied between lighter-load conditions and heavier-load conditions. By way of non-limiting example, test circuitry 135 can be configured to produce control signal 170-1 to control a state of switch 150-3, which controls the electrical connectivity of the energy storage resource 125 to respective load 118. Use of test circuitry 135 will be discussed in more detail the following figures.

Figure 3:
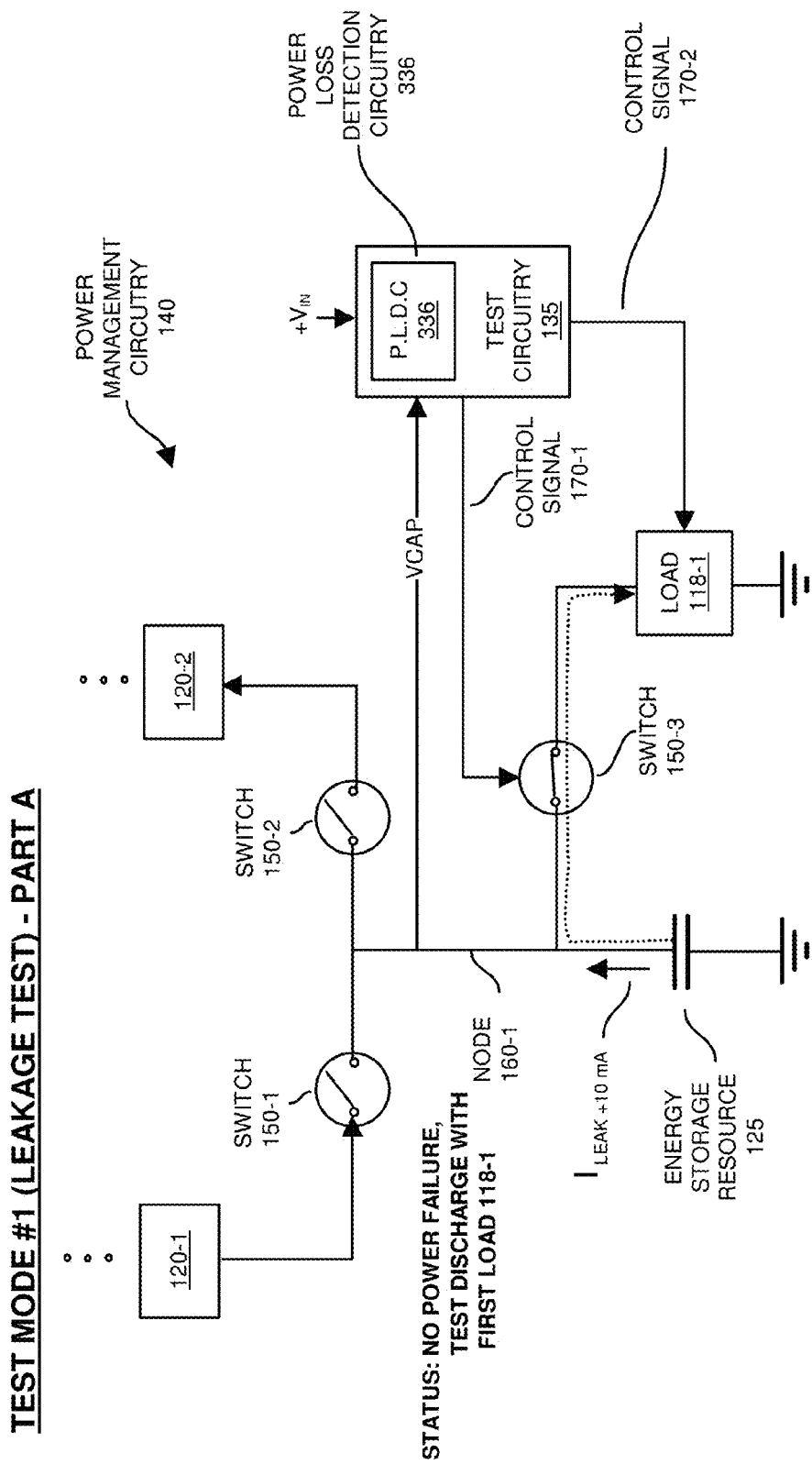
FIG. 3 is an example diagram illustrating a first discharge test according to embodiments herein.
Figure 4:
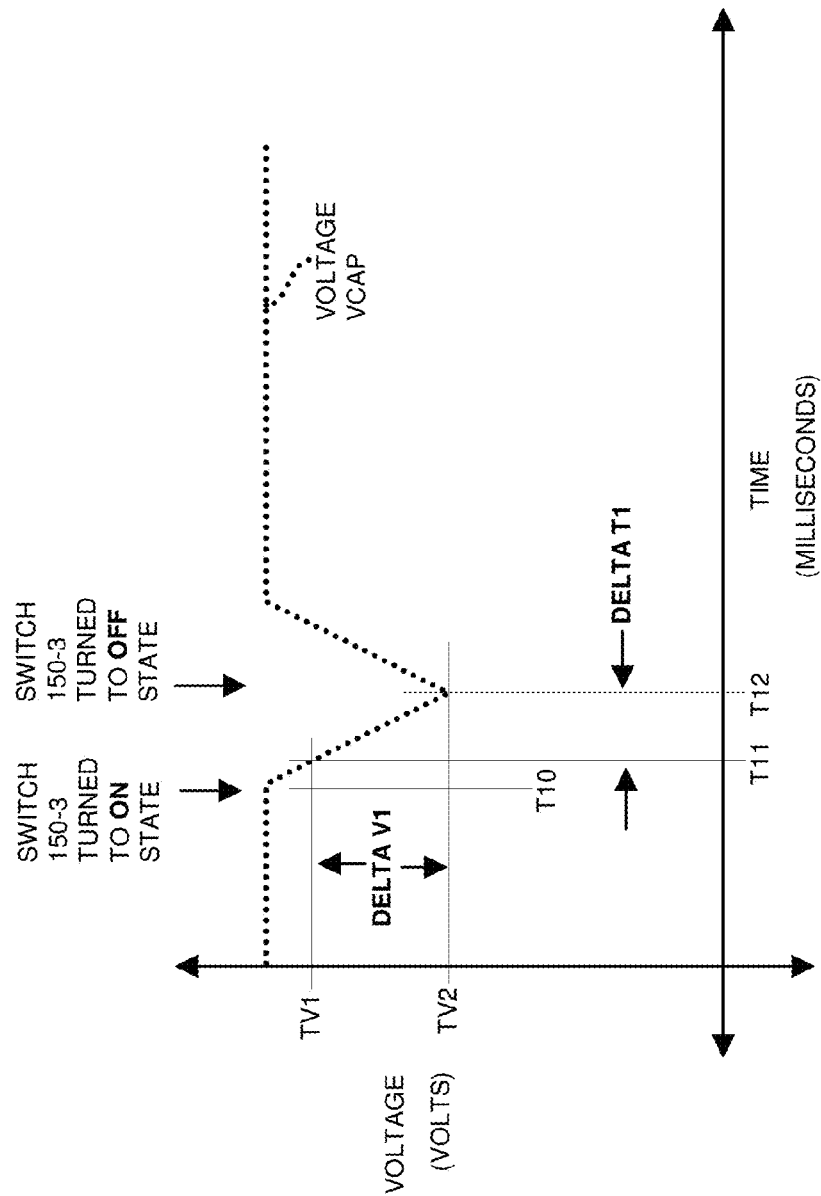
FIG. 4 is an example diagram illustrating monitoring of the output voltage of the energy storage resource during the first discharge test according to embodiments herein.
Figure 5:
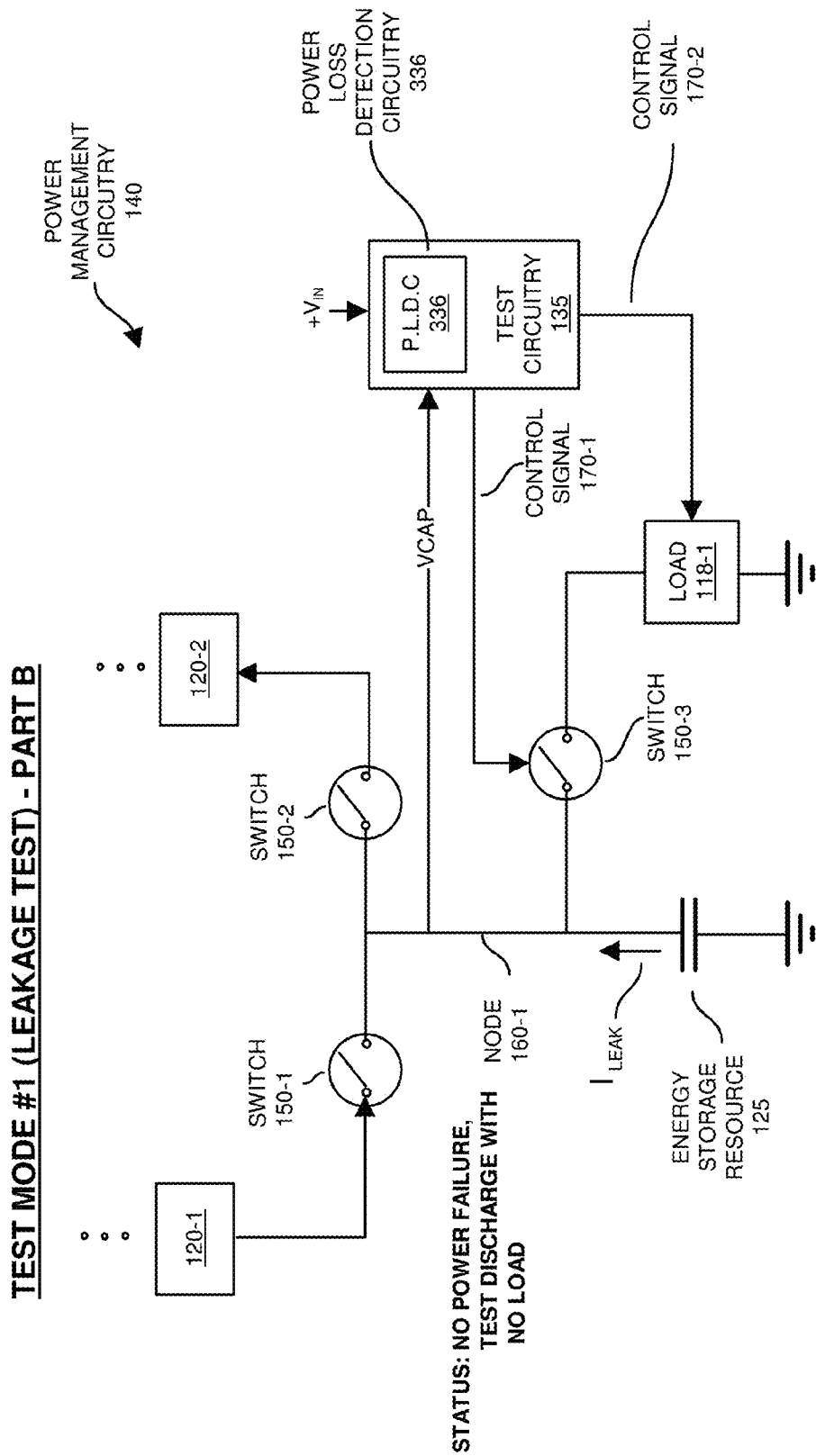
FIG. 5 is an example diagram illustrating a second discharge test according to embodiments herein.
Figure 6:
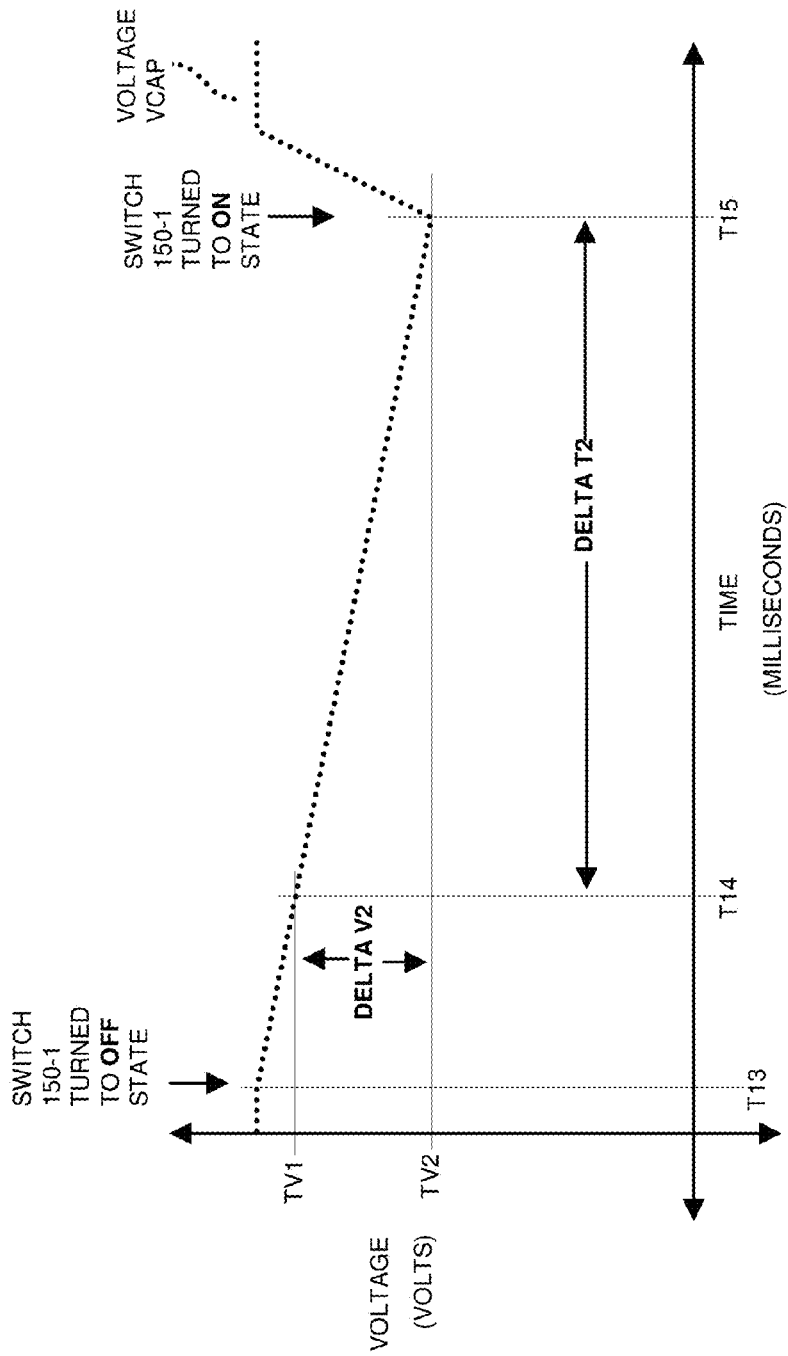
FIG. 6 is an example diagram illustrating monitoring of the output voltage of the energy storage resource during the second discharge test according to embodiments herein.

In general, FIG. 3 illustrates a test condition in which energy from the energy storage resource 125 is discharged at a first discharge rate through a first load; FIG. 4 is associated with FIG. 3 and illustrates measurement of the voltage decay associated with the voltage VCAP on the energy storage resource 125 over time when discharging energy at the first discharge rate through the first load; FIG. 5 illustrates a test condition in which energy from the energy storage resource 125 is discharged at a second discharge rate when no load is connected to the energy storage resource 125; FIG. 6 is associated with FIG. 5 and illustrates measurement of the voltage decay associated with the voltage VCAP on the energy storage resource 125 over time when discharging energy at the second discharge rate (i.e., during a no load condition).

Circuitry used to store the backup energy is susceptible to leakage. As previously discussed, there are one or more paths (other than through the corresponding load) in which energy stored in energy storage resource 125 can be dissipated other than through a corresponding load. For example, a portion of energy in the energy storage resource 125 can leak from one capacitor plate to another capacitor plate in the energy storage resource 125 to ground; a portion of the energy and energy storage resource 125 can leak from a respective node 160-1 to test circuitry 135; a portion of energy stored in energy storage resource 125 can leak from respective node 160-1 through one or more switches; etc.

Energy lost due to leakage is not available for use by the regulator circuitry 120-2 power electronic circuitry 110 during a power loss condition. Embodiments herein can include measuring leakage and taking the leakage into account when determining amount of usable holdup energy stored in the respective energy storage resource 125 to provide backup power during a respective power failure condition. Additionally, and perhaps more importantly, the leakage current associated with energy storage resource 125 may strongly impact the estimation of an amount of capacitance associated with energy storage resource 125.

More specifically, as shown in FIG. 3, during part A of the leakage test, the test circuitry 135 produces control signal 170-1 to control switch 150-3 to an ON state. The test circuitry 135 or other suitable resource such as power management circuitry 140 sets both switch 150-1 and switch 150-2 to OFF states. During part A of the leakage test as shown in FIG. 3, the test circuitry 135 produces control signal 170-2 to configure load 118-1. Assume in this example embodiment that the test circuitry 135 controls load 118-1 to draw a predetermined current such as 10 mA (milliamps) from the energy storage resource 125. As backup energy is consumed from energy storage resource 125 via 10 mA current consumption through the load 118-1, the test circuitry 135 monitors a decay of magnitude of voltage VCAP at node 160-1 over time. This is more particularly shown in FIG. 4.

As shown in FIG. 4, the voltage VCAP decays as a result of turning switch 150-3 to an ON state at time T10 during which the backup energy stored in energy storage resource 125 is consumed by load 118-1. As previously discussed, in addition to a portion of the backup energy stored in energy storage resource 125 being consumed by the respective load 118-1, a portion of the backup energy stored in energy storage resource 125 is also lost as a result of leakage current. Thus, the discharge rate in part A of test mode #1 represents a sum of the leakage discharge and discharge of energy in energy storage resource 125 due connecting of the node 160-1 of energy storage resource 125 to the load 118-1.

Based on the test set of conditions as previously discussed in FIG. 3, the test circuitry 135 keeps track of how much time (DELTA T1) it takes for the voltage VCAP associated with node 160-1 of energy storage resource 125 to drop from a first threshold value TV1 to a second threshold value TV2. In this non-limiting example embodiment, the rate of voltage decay is substantially constant because the test circuitry 135 controls load 118-1 to draw a substantially constant current 10 mA. In addition to tracking DELTA T1, the test circuitry 135 also can be configured to keep track of a difference (DELTA V1) between threshold value TV1 and threshold value TV2. However, note that, in one embodiment, the threshold values TV1 and TV2 are configured values chosen as setpoints. In such an instance, there is no need to track the value DELTA V1 because it can be calculated based on the setting of test circuitry 135.

In one embodiment, the test circuitry 135 starts a respective counter (or other suitable resource) at time T11 in response to detecting that the voltage VCAP substantially equals threshold value TV1.

In response to detecting that the voltage of VCAP is substantially equal threshold value TV2 at time T12, the test circuitry 135 stops the counter and produces control signal 170-1 to control switch 150-3 to an OFF state again to prevent further discharge of the holdup energy stored in the energy storage resource 125. Test circuitry 135 or other suitable resource such as power management circuitry 140 controls switch 150-1 to an ON state such that the voltage VCAP increases to a pre-discharge level again in which the energy storage resource 125 is fully charged.

During this first discharge test of discharging backup energy in the energy storage resource 125 at the first energy discharge rate, via the respective counter, the test circuitry 135 produces a first elapsed time value DELTA T1. The elapsed time value DELTA T1 represents an amount of time that a respective voltage magnitude VCAP of the energy storage resource 125 falls from a first threshold voltage value TV1 to a second threshold voltage value TV2.

During part A of the test mode #1 (leakage test), assume that the load 118-1 draws 10 mA. The amount of leakage during this portion of the test is unknown. Thus, the output current of the energy storage resource 125 is $I_{LEAK+10\ mA}$.

It is known that:

$$I_{10\ mA+LEAK} = I_{10\ mA} + I_{LEAK} = C(dV_{LEAK+10\ mA}/dT_{LEAK+10\ mA}),\text{ where:}$$

C=an unknown capacitance of the energy storage resource 125, $I_{LEAK+10\ mA}$=current from energy storage resource 125 due to leakage plus 10 mA load current from load 118-1, $I_{10\ mA}$=10 mA current outputted from energy storage resource 125 to load 118-1, $I_{LEAK}$=unknown value of leakage current, $dV_{LEAK+10\ mA}$=a change in voltage VCAP of the energy storage resource 125, known value DELTA V1, $dT_{LEAK+10\ mA}$=a change in time (measured as DELTA T1).

Thus, $C*dV_{LEAK+10\ mA} = (I_{10\ mA} + I_{LEAK})*dT_{LEAK+10\ mA}$

As discussed further below, the time value DELTA T1 ($dT_{LEAK+10\ mA}$) will be used to determine an ability of the energy storage resource 125 to store holdup (backup) energy.

FIG. 5 is an example diagram illustrating a second discharge test according to embodiments herein.

After the energy storage resource 125 is recharged to a full state again via setting switch 150-1 to an ON state, the power management circuitry 140 sets switch 150-1 and switch 150-2 to an OFF state.

During part B of the leakage test (test mode #1), the test circuitry 135 produces control signal 170-1 to maintain switch 150-3 to an OFF state. This prevents the holdup energy stored in energy storage resource 125 from being dissipated through load 118-1. Even though switches 150-1, 150-2, and 150-3, are all set to an OFF (open) state in this portion of the test, the holdup energy stored in energy storage resource 125 is discharged through any of one or more leakage paths to ground. As backup energy is consumed from energy storage resource 125, the test circuitry 135 monitors a decay of magnitude of voltage VCAP at node 160-1 over time. This is more particularly shown in FIG. 6.

As further shown in FIG. 6, the voltage VCAP decays as a result of consumption of the holdup energy due to leakage as previously discussed. The test circuitry 135 keeps track of how much time (DELTA T2) it takes for the voltage VCAP associated with node 160-1 of energy storage resource 125 to drop from a first threshold value TV1 to a second threshold value TV2. In this example embodiment, the rate of decay is substantially constant. In addition to tracking DELTA T2, the test circuitry 135 also keeps track of a difference (DELTA V2) between threshold value TV1 and threshold value TV2.

In one embodiment, the test circuitry 135 starts a counter at time T14, which corresponds to the voltage VCAP being substantially equal to or dropping below a threshold value TV1. In response to detecting that the voltage of VCAP is substantially equal to or has dropped below threshold value TV2 at time T15, the test circuitry 135 stops the counter. At or around time T15, the power management circuitry 140 controls switch 150-1 to an ON state again to recharge the energy storage resource 125.

During this second discharge test of discharging backup energy in the energy storage resource 125 at the second energy discharge rate (to test leakage), the test circuitry 135 produces a second elapsed time value DELTA T2. As previously discussed, the elapsed time value DELTA T2 represents an amount of time that a respective voltage magnitude VCAP of the energy storage resource 125 falls from a first threshold voltage value TV1 to a second threshold voltage value TV2.

During part B of the test mode #1 (leakage test), there is no load. The test circuitry 135 electrically isolates the energy storage resource 125 from load 118-1 to discharge holdup energy stored in the energy storage resource 125. Thus, any discharge of the holdup energy in the energy storage resource 125 during test mode #1 part B is due to leakage.

Embodiments herein assume that the leakage during part B is the same as the leakage during part A.

It is known that:

$$I_{LEAK} = C(dV_{LEAK}/dT_{LEAK}),\text{ where:}$$

C=an unknown capacitance of the energy storage resource 125, $I_{LEAK}$=unknown current from energy storage resource 125 due to leakage, $dV_{LEAK}$=a change in voltage VCAP of the energy storage resource 125 during part B of the leak test, known value (DELTA V2), and $dT_{LEAK}$=a change in time (DELTA T2) as measured during the part B of the leak test.

Thus, $C*dV_{LEAK} = I_{LEAK}*dT_{LEAK}$.

Assume in this example embodiment that the difference in voltage between threshold value TV1 and threshold value TV2 is equal to one volt. For example, by way of non-limiting example, threshold value TV1 may be selected to be 32 volts; threshold value TV2 may be selected to be 31 volts. In such an instance, DELTA V1 ($dV_{LEAK+10\ mA}$) and DELTA V2 ($dV_{LEAK}$) and are both equal to 1 volt. Therefore:

$$C*dV_{LEAK} = I_{LEAK}*dT_{LEAK} = C*dV_{LEAK+10\ mA} = (I_{10\ mA} + I_{LEAK})*dT_{LEAK+10\ mA}$$

$$I_{LEAK}*dT_{LEAK} = (I_{10\ mA} + I_{LEAK})*dT_{LEAK+10\ mA}$$

$$I_{LEAK}*dT_{LEAK} = (I_{10\ mA}*dT_{LEAK+10\ mA}) + (I_{LEAK}*dT_{LEAK+10\ mA})$$

$$(I_{LEAK}*dT_{LEAK}) - (I_{LEAK}*dT_{LEAK+10\ mA}) = (I_{10\ mA}*dT_{LEAK+10\ mA})$$

$$I_{LEAK}(dT_{LEAK} - dT_{LEAK+10\ mA}) = (I_{10\ mA}*dT_{LEAK+10\ mA})$$

$$I_{LEAK} = (I_{10\ mA}*dT_{LEAK+10\ mA})/(dT_{LEAK} - dT_{LEAK+10\ mA})$$

Assume in this example that Delta T1=25 milliseconds, and that Delta T2=275 milliseconds.

Recall that:

$dT_{LEAK+10\ mA}$=a change in time (DELTA T1).

$dT_{LEAK}$=a change in time (DELTA T2).

Therefore:

$$I_{LEAK} = (I_{10\ mA}*DELTA\ T1)/(DELTA\ T2 - DELTA\ T1)$$

Utilizing the first elapsed time value (DELTA T1) and the second elapsed time (DELTA T2) value to estimate an amount of the backup energy stored in the energy storage resource that is available to power the electronic circuitry 110 during the power failure condition. For example, plugging in values:

$$I_{LEAK} = (I_{10\ mA}*25\ mS)/(275\ mS - 25\ mS)$$

$$I_{LEAK}=(10\text{ mA}*25\text{ mS})/(275\text{ mS}-25\text{ mS})=1\text{ mA}$$

Capacitance of energy storage resource 125=C=
$(I_{LEAK}*dT_{LEAK})/dV_{LEAK}$ $$C=(1\text{ mA}*275\text{ mS})/1=275\text{ microfarads}$$

In one embodiment, the calculated capacitance, C, associated with the energy storage resource 125 is compared to a corresponding threshold value such as $C_{th}$. The threshold value $C_{th}$ represents a predetermined minimum amount of capacitance that is required to store enough energy to hold up generation of the output voltages 190 for a sufficient time to power the electronic circuitry 110 during a respective power failure condition.

Embodiments herein can include comparing the calculated capacitance, C, to the threshold value $C_{th}$ to determine whether the capacitance associated with the energy storage resource 125 is sufficient. For example, if the calculated capacitance, C, is greater than the threshold value, $C_{th}$, then it is assumed that the energy storage resource 125 will be sufficient for the regulator circuitry 120-2 to hold up the output voltages 190 just after loss of primary power 105. Thus, output voltages 190 from regulator circuitry 120-2 will be uninterrupted during the loss of power 105 and sufficient energy is still available from energy storage resource 125. Eventually, after a holdup time, energy in energy storage resource 125 will be depleted due to consumption by regulator circuitry 120-2 producing output voltages 190; at such time, after depletion, the output voltages 190 will drop to zero volts because no more energy is available from primary power 105 or energy in the energy storage resource 125. Conversely, if the calculated capacitance, C, is less than the threshold value, $C_{th}$, then it is assumed that the energy storage resource 125 does not store sufficient energy for the regulator circuitry 120-2 to hold up the output voltages 190 during the respective loss of primary power 105 for a sufficient amount of holdup time.

Note that the effective capacitance, $C_{EFFECTIVE}$, of storing holdup energy in the energy storage resource 125, while taking into account the leakage current of 1 mA, is as follows:

The effective capacitance of energy storage resource 125=$C_{EFFECTIVE}$. For a 10 mA draw during a power failure condition:

$$C_{EFFECTIVE}(10\text{ mA})=C*(I_{10\text{ }mA}/[I_{10\text{ }mA}+I_{LEAK}])$$

$$C_{EFFECTIVE}(10\text{ mA})=275\text{ microfarads}*(10\text{ mA}/[10\text{ mA}+1\text{ mA}])=250$$

microfarads for a discharge rate of 10 mA supplied to a load. In other words, for a load of 10 mA, around 90.9% of the backup energy stored in the energy storage resource 125 is usable during a power failure to power regulator circuitry 120-2 if the draw of holdup energy from the energy storage resource 125 is a current of 10 mA.

For a 100 mA draw from energy storage resource 125 during a power failure condition:

$$C_{EFFECTIVE}(100\text{ mA})=C*(I_{100\text{ }mA}/[I_{100\text{ }mA}+I_{LEAK}])$$

$$C_{EFFECTIVE}(100\text{ mA})=275\text{ microfarads}*(100\text{ mA}/[100\text{ mA}+1\text{ mA}])=272.27$$

microfarads for a discharge rate of 100 mA supplied to a load. In other words, around 99% of the backup energy stored in the energy storage resource 125 is usable during a power failure to power regulator circuitry 120-2 if the draw of holdup energy from the energy storage resource 125 is a current of 100 mA.

For a 1000 mA draw from energy storage resource 125 during a power failure condition:

$$C_{EFFECTIVE}(1000\text{ mA})=C*(I_{1000\text{ }mA}/[I_{1000\text{ }mA}+I_{LEAK}])$$

$$C_{EFFECTIVE}(1000\text{ mA})=275\text{ microfarads}*(1000\text{ mA}/[1000\text{ mA}+1\text{ mA}])=275$$

microfarads for a discharge rate of 1000 mA supplied to a load. In other words, around 99.9% of the backup energy stored in the energy storage resource 125 is usable during a power failure to power regulator circuitry 120-2 if the draw of holdup energy from the energy storage resource 125 is a current of 1000 mA.

Utilizing the leakage test as discussed above, it is possible to identify a more accurate capacitance associated with the energy storage resource 125. That is, taking into account the leakage current, the calculated capacitance of energy storage resource 125 is much more accurate value over conventional techniques.

Accordingly, test circuitry 135 can be configured to monitor a discharge of the backup energy stored in the energy storage resource 125 at the different energy discharge rates to identify a leakage current associated with the energy storage resource. The leakage current is unavailable to support holdup of the electronic circuitry 110 during occurrence of the power failure condition. Based at least in part on the leakage current, embodiments herein include calculating an available amount of energy in the energy storage resource for powering the electronic circuitry during the power failure condition.

If desired, further embodiments herein can include producing a value representative of an amount of energy in the energy storage resource available to power the electronic circuitry during the power failure condition. Assuming that the energy storage resource 125 is an ideal capacitor:

$$E=0.5*(C_{EFFECTIVE})*VCAP^2$$

where E=energy stored in energy storage resource 125 available to power respective regulator circuitry 120-2 during a power failure condition, VCAP=the initial voltage of VCAP prior to the power failure condition, where $C_{EFFECTIVE}$=available capacitance for storing the available holdup energy.

In one embodiment, the test circuitry 135 or other suitable resource compares the produced value, E, to an energy threshold value to determine whether the energy storage resource 125 stores sufficient energy for a desired duration of holdup after the power failure condition. The energy threshold value represents an amount of energy that is needed to be stored in energy storage resource 125 prior to the occurrence of the power failure condition.

In response to detecting that the produced value, E, is greater than the energy threshold value, the test circuitry 135 produces status information indicating that the energy storage resource 125 stores sufficient energy to power the electronic circuitry 110 for a sufficient amount of time after a power failure condition in which primary power 105 is lost. In response to detecting that the produced value, E, is less than the energy threshold value, the test circuitry 135 produces status information indicating that the energy storage resource 125 does not store sufficient energy to power the electronic circuitry 110 during the power failure condition. The status information can be displayed on a respective display screen, lighting of an LED (Light Emitting Diode), etc., in order to notify a respective user whether or not the energy storage resource 125 stores sufficient amount of energy to hold up the electronic circuitry 110 during the power failure condition. Corrective action can be taken to replace the energy storage resource 125 (or a respective electronic circuitry 110 such as a solid-state drive including the energy storage resource 125) if the produced value, E, is below the energy threshold value.

Referring again to FIG. 3, note that a power failure condition can occur during a test mode such as when energy stored in the energy storage resource 125 is being discharged. The test circuitry 135 can include power loss detection circuitry 336 to monitor primary power 105 (voltage Vin). As previously discussed, the test circuitry 135 occasionally or periodically tests the ability (such as using test mode #1 or test mode #2) of energy storage resource 125 to store corresponding backup energy. Note that it is possible that a power failure occurs during a respective test mode in which the test circuitry 135 control switch 150-3 to an ON position such that the backup energy in energy storage resource 125 is dissipated by load 118-1.

Assume that a power failure occurs during a mode of discharging backup energy from energy storage resource 125 through switch 150-3 to load 118-1. Power loss detection circuitry 336 monitors primary power 105 (such as a magnitude of voltage Vin) and detects the loss of power condition. As previously discussed, this can include detecting that the input voltage Vin drops below a threshold value. In response to detecting occurrence of the failure condition during the test mode in which the backup energy is discharged from the energy storage resource 125, the test circuitry 135 immediately terminates discharging of the backup energy stored in the energy storage resource 125 to the load 118.

Accordingly, in one embodiment, during a test mode, the test circuitry 135 can be configured to discharge the backup energy stored in the energy storage resource 125 to an auxiliary load (load 118-1) with respect to the electronic circuitry 110. The power loss detection circuitry 336 can be configured to monitor a primary power 105 (voltage Vin) used to power the electronic circuitry 110 during the test mode.

In response to detecting occurrence of the power failure condition with respect to the primary power 105 (such as voltage Vin drops below a threshold value), the test circuitry 135: i) controls switch 150-3 to an OFF state (if it was ON) to terminate discharging of the holdup energy from the energy storage resource 125 to the auxiliary load 118-1, and ii) activates switch 150-2 to an ON state to utilize the backup energy in the energy storage resource 125 to deliver energy from energy storage resource 125 to regulator circuitry 120-2) to provide continued power to electronic circuitry 110. In this instance, discontinuing discharge of the backup energy stored in energy storage resource 125 when the failure is detected with respect to primary power 105 ensures that the backup energy stored in energy storage resource 125 is available for use by regulator circuitry 120-2 to provide uninterrupted power to electronic circuitry 110 as opposed to being discharged in load 118-1.

In accordance with further embodiments, note that if a failure of primary power 105 occurs during a test mode in which the test circuitry 135 discharges backup energy stored in energy storage resource 125 to an auxiliary load 118, the power management circuitry 140 aborts the process of calculating the usable amount of energy in the energy storage resource 125 to holdup electronic circuitry 110.

Figure 7:
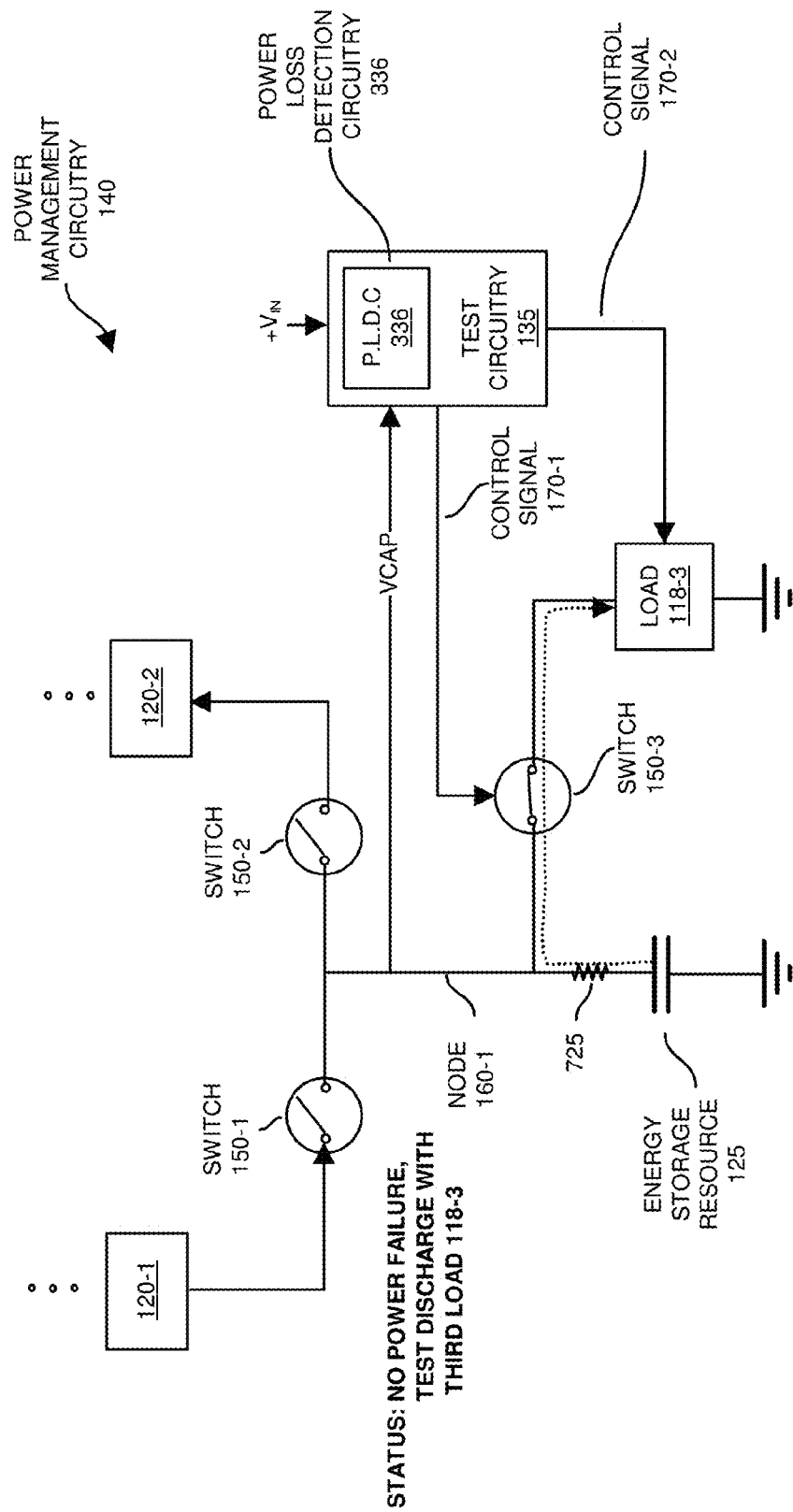
FIG. 7 is an example diagram illustrating a third discharge test according to embodiments herein.
Figure 8:
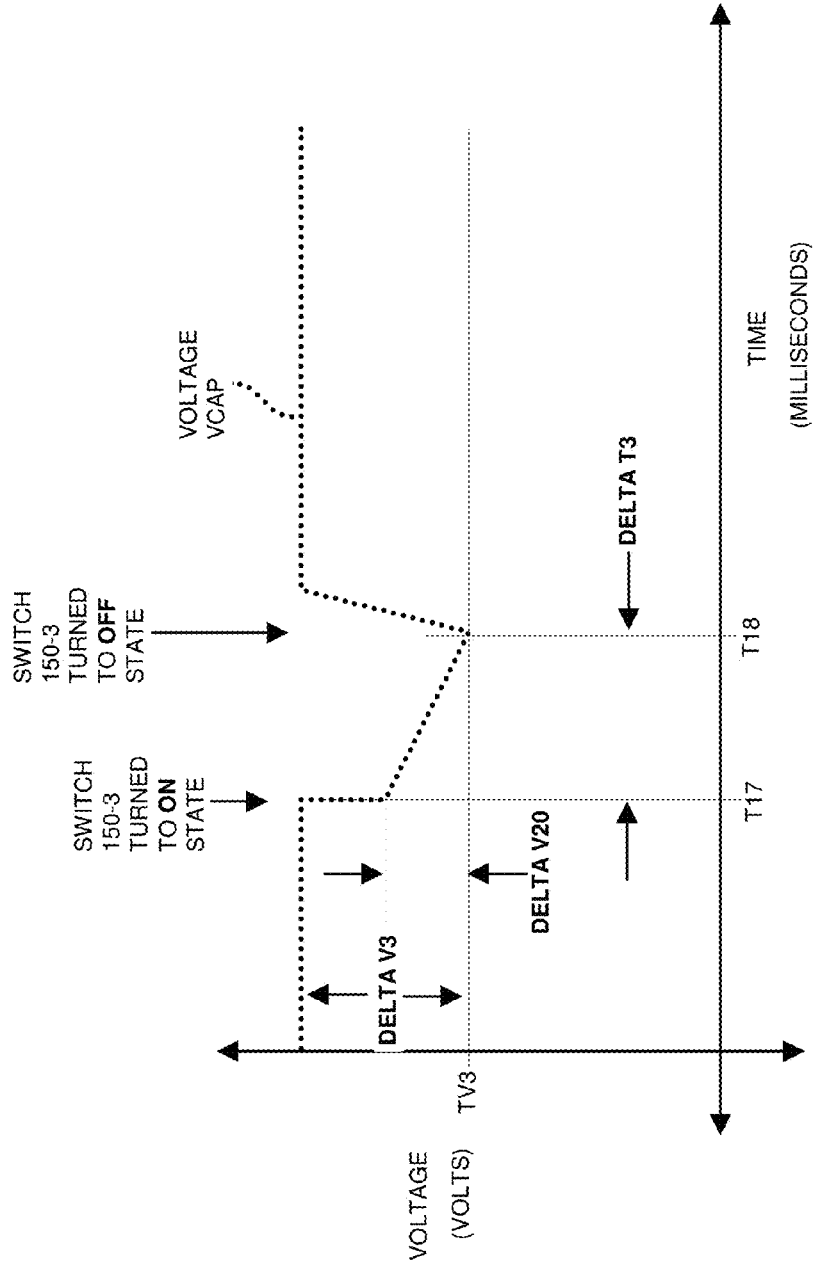
FIG. 8 is an example diagram illustrating monitoring of the output voltage of the energy storage resource during the third discharge test according to embodiments herein.
Figure 9:
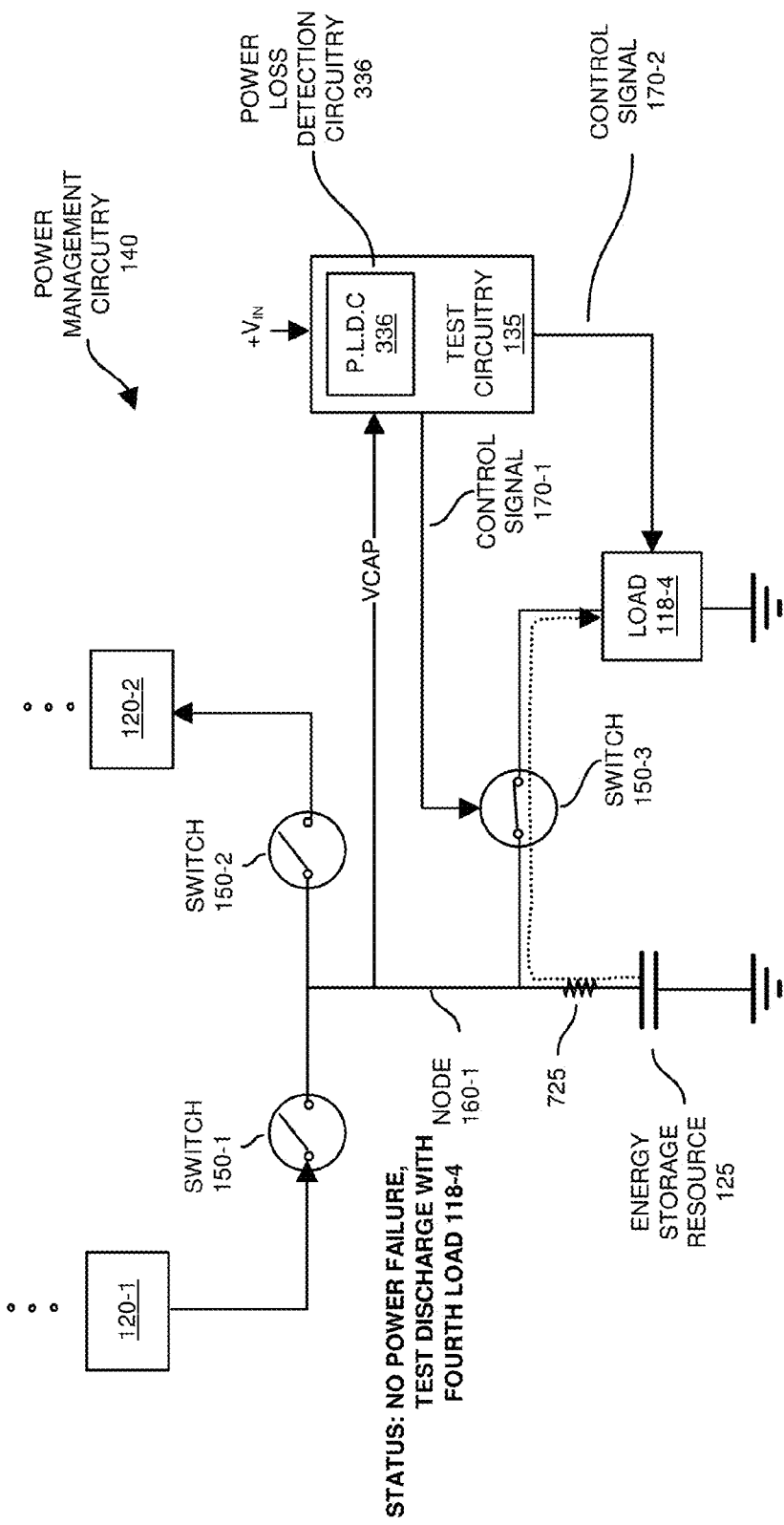
FIG. 9 is an example diagram illustrating a fourth discharge test according to embodiments herein.
Figure 10:
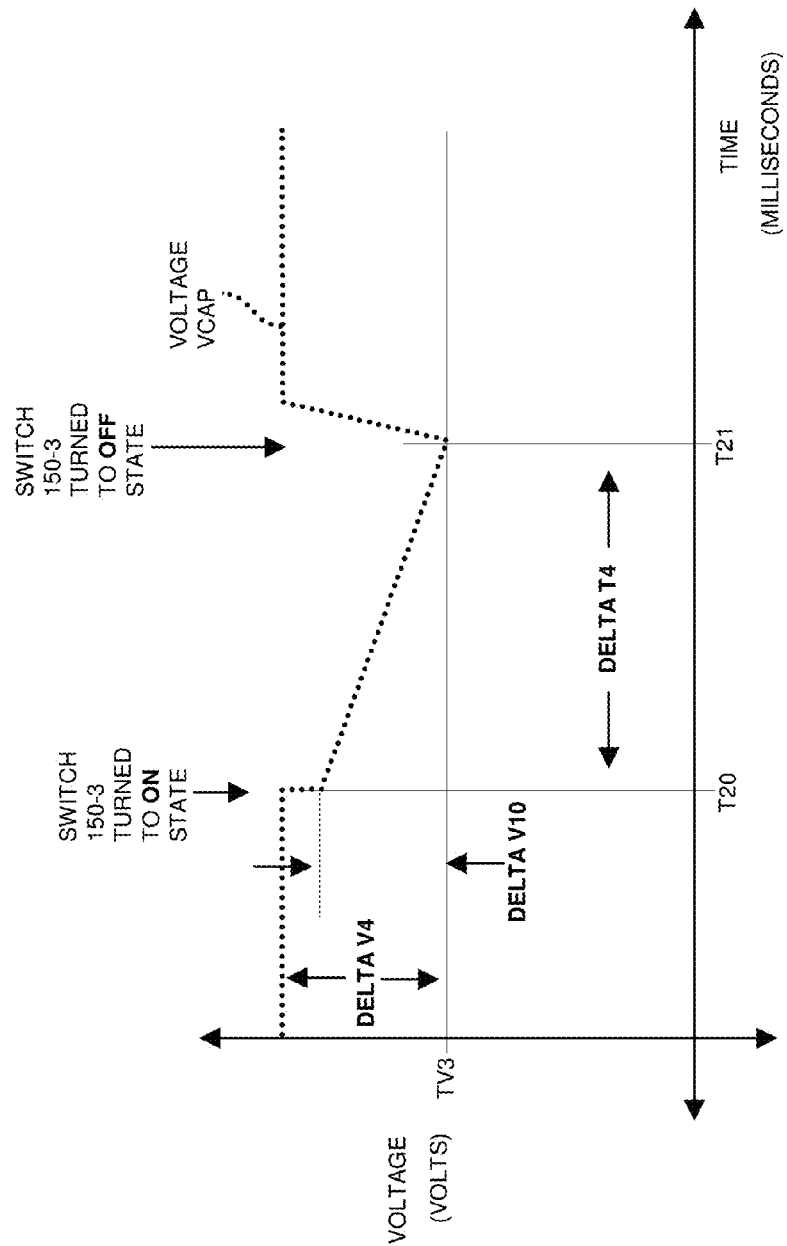
FIG. 10 is an example diagram illustrating monitoring of the output voltage of the energy storage resource during the fourth discharge test according to embodiments herein.

In general, FIG. 7 illustrates a respective circuit in which energy from the energy storage resource 125 is discharged at a third discharge rate through a load; FIG. 8 is associated with FIG. 7 and illustrates measurement of the voltage decay associated with the voltage VCAP on the energy storage resource 125 over time when discharging energy at the third discharge rate through the load; FIG. 9 illustrates discharge of energy from the energy storage resource 125 at a fourth discharge rate through a respective load; FIG. 10 is associated with FIG. 9 and illustrates measurement of the voltage decay associated with the voltage VCAP on the energy storage resource 125 over time when discharging energy at the fourth discharge rate.

In one embodiment, the data obtained during the different discharge tests as shown in FIGS. 7 through 10 are used to determine an equivalent series resistance associated with the energy storage resource 125. As discussed more particularly below, the test circuit 135 can be configured to monitor discharge of the backup energy from the energy storage resource 125 at different energy discharge rates. Based on monitoring the discharge at the different energy discharge rates, and obtained results (such as DELTA T3, DELTA T4), the test circuitry 135 or other suitable resource calculates an equivalent series resistance 725 of the energy storage resource 125.

More specifically, FIG. 7 is an example diagram illustrating a third discharge test according to embodiments herein.

After the energy storage resource 125 is recharged to a full state via setting switch 150-1 to an ON state, the power management circuitry 140 or other suitable resource such as test circuitry 135 sets each of switch 150-1 and switch 150-2 to an OFF state to perform part A of test mode #2 (equivalent series resistance test).

During part A of the resistance test (test mode #2), the test circuitry 135 produces control signal 170-1 to control switch 150-3 to an ON state. As previously discussed, the power management circuitry 140 or other suitable resource controls switch 150-1 and switch 150-2 to OFF states. During part A of the resistance test, the test circuitry 135 produces control signal 170-2 to configure load 118-3. Assume in this example embodiment that the test circuitry 135 controls load 118-3 to draw a predetermined current such as 20 mA (milliamps) from the energy storage resource 125. As backup energy is consumed from energy storage resource 125, the test circuitry 135 monitors a decay of magnitude of voltage VCAP at node 160-1 over time. This is more particularly shown in FIG. 7.

As shown in FIG. 7, the voltage VCAP decays as a result of turning switch 150-3 to an ON state during which the backup energy stored in energy storage resource 125 is consumed by load 118-3 (20 mA).

During part A of test mode #2, the test circuitry 135 monitors a decay of the voltage VCAP. For example, the test circuitry 135 keeps track of how much time (DELTA T3) it takes for the voltage VCAP associated with node 160-1 of energy storage resource 125 to drop from an initial voltage (as measured just prior to and time T17) to threshold voltage TV3. In this example embodiment, the rate of decay is substantially constant because the test circuit 135 controls load 118-3 to draw a substantially constant current 20 mA. In addition to tracking Delta T3, the test circuitry 135 also keeps track of a difference (DELTA V3) between the initial voltage of VCAP and the threshold value TV3.

To generate time difference DELTA T3, the test circuitry 135 starts a counter at time T17 at a time when switch 150-3 is turned ON. In response to detecting that the voltage of VCAP has dropped to threshold value TV3 at time T18, the test circuitry 135 stops the counter and produces control signal 170-1 to control switch 150-3 to an OFF state again to prevent further discharge of the holdup energy stored in the energy storage resource 125. The elapsed time as captured by the counter in or associated with test circuitry 135 represents DELTA T3. Power management circuitry 140 controls switch 150-1 to an ON state such that the voltage VCAP increases to a pre-discharge level again in which the energy storage resource 125 is fully charged again.

During part A of the test mode #1 (resistance test), assume that the load 118-3 draws 20 mA.

in furtherance of determining a value for R, it is known that:

$$\text{DELTA } V20 = \text{DELTA } V3 - I_{20\ mA} * R,$$

where DELTA V20 represents an unknown voltage difference as shown in FIG. 8, $I_{20\ mA}$ = current through the load such as 20 mA, R = the unknown equivalent series resistance 725 associated with energy storage resource 125.

It is further known that:

$$I_{20\ mA} = C * (\text{DELTA } V20/\text{DELTA } T3)$$

$$C = (I_{20\ mA} * \text{DELTA } T3)/\text{DELTA } V20$$

These equations will be used below to produce a value for the equivalent series resistance value, R.

FIG. 9 is an example diagram illustrating a fourth discharge test according to embodiments herein.

After the energy storage resource 125 is recharged to a full state again via setting switch 150-1 to an ON state, the power management circuitry 140 sets switch 150-1 and switch 150-2 to an OFF state to perform part B of test mode #2.

During part B of the resistance test (test mode #2), the test circuitry 135 produces control signal 170-1 to control switch 150-3 to an ON state. As previously discussed, the power management circuitry 140 or other suitable resource controls switch 150-1 and switch 150-2 to OFF states.

During part B of the resistance test, the test circuitry 135 produces control signal 170-2 to configure load 118-4. Assume in this example embodiment that the test circuitry 135 controls load 118-4 to draw a different predetermined current such as 10 mA (milliamps) from the energy storage resource 125. As backup energy is consumed from energy storage resource 125, the test circuitry 135 monitors a decay of magnitude of voltage VCAP at node 160-1 over time. This is more particularly shown in FIG. 10.

As shown in FIG. 10, the voltage VCAP decays as a result of turning switch 150-3 to an ON state during which the backup energy stored in energy storage resource 125 is consumed by load 118-4.

During part B of test mode #2, the test circuitry 135 monitors a decay of the voltage VCAP. For example, the test circuitry 135 keeps track of how much time (DELTA T4) it takes for the voltage VCAP associated with node 160-1 of energy storage resource 125 to drop from an initial voltage (as measured just prior to time T20) to threshold voltage TV3. In this example embodiment, the rate of decay is substantially constant because the test circuit 135 controls load 118-4 to draw a substantially constant current 10 mA. In addition to tracking DELTA T4, as shown, the test circuitry 135 also keeps track of a difference (DELTA V4) between the initial voltage of VCAP and the threshold value TV3 as shown.

To generate time difference DELTA T4, the test circuitry 135 starts a counter at time T20 at a time when switch 150-3 is turned ON. In response to detecting that the voltage of VCAP has dropped to threshold value TV3 at time T21, the test circuitry 135 stops the counter and produces control signal 170-1 to control switch 150-3 to an OFF state again to prevent further discharge of the holdup energy stored in the energy storage resource 125. The elapsed time as captured by the counter represents DELTA T4. Power management circuitry 140 controls switch 150-1 to an ON state such that the voltage VCAP increases to a pre-discharge level again in which the energy storage resource 125 is fully charged.

During part B of the test mode #2 (resistance test), assume that the load 118-4 draws 10 mA.

In furtherance of determining a value for the equivalent series resistance, R, it is known that:

$$\text{DELTA } V10 = \text{DELTA } V4 - I_{10\ mA} * R,$$

where DELTA V10 represents an unknown voltage difference as shown in FIG. 10, $I_{10\ mA}$ = current through the load such as 10 mA, R = the unknown equivalent series resistance 725 associated with energy storage resource 125.

It is further known that:

$$I_{10\ mA} = C * (\text{DELTA } V10/\text{DELTA } T4)$$

$$C = (I_{10\ mA} * \text{DELTA } T4)/\text{DELTA } V10$$

Recall from above that:

$$I_{20\ mA} = C * (\text{DELTA } V20/\text{DELTA } T3)$$

$$C = (I_{20\ mA} * \text{DELTA } T3)/\text{DELTA } V20$$

Based on combining because they are equal:

$$C = (I_{10\ mA} * \text{DELTA } T4)/\text{DELTA } V10 = C = (I_{20\ mA} * \text{DELTA } T3)/\text{DELTA } V20$$

$$I_{10\ mA} * \text{DELTA } T4 * \text{DELTA } V20 = I_{20\ mA} * \text{DELTA } T3 * \text{DELTA } V10$$

However, recall that:

$$\text{DELTA } V10 = \text{DELTA } V4 - I_{10\ mA} * R,$$

$$\text{DELTA } V20 = \text{DELTA } V3 - I_{20\ mA} * R,$$

Using substitution DELTA V4–$I_{10\ mA}$*R for DELTA V10 and substitution DELTA V3–$I_{20\ mA}$*R for DELTA V20:

$$I_{10\ mA} * \text{DELTA } T4 * (\text{DELTA } V3 - I_{20\ mA} * R) = I_{20\ mA} * \text{DELTA } T3 * (\text{DELTA } V4 - I_{10\ mA} * R)$$

Because threshold value TV3 is known, assume that DELTA V3 = DELTA V4 = DELTA V.

Solving for the value R:

$$R = \text{DELTA } V * [I_{10\ mA} * \text{DELTA } T3 - I_{20\ mA} * \text{DELTA } T4]/[I_{10\ mA} * I_{20\ mA} * (\text{DELTA } T4 - \text{DELTA } T3)]$$

Assume that the test circuitry 135 obtains the following values during the previous tests:
DELTA V3 = DELTA V4 = 1 volt,
DELTA T3 = 4.9 milliseconds, and
DELTA T4 = 9.9 milliseconds.

In such an instance, the test circuitry 135 or other suitable resource uses these values to determine that the equivalent series resistance 725 has a value of one ohm as follows:

$$R = [(20\ mA)(4.9\ mS) - (10\ mA)(9.9\ mS)]/[(10\ mA)(20\ mA)(4.9\ mS - 9.9\ mS)] = 1\ \text{ohm}$$

This R value (or equivalent series resistance 725) can be used to determine losses in the energy storage resource 125 during discharge. For example, if the regulator circuitry 120-2 draws 250 mA during the power failure condition, then the output voltage of the energy storage resource 125 will be VCAP–(250 mA*1 ohm). The energy consumed by the equivalent series resistance value will not be available for use by the regulator circuitry 120-2 to holdup the output voltages 190 during the power failure condition.

The loss of power based on the equivalent series resistance value are can be used independently of leakage loss as discussed above. Alternatively, the equivalent series resistance value 725 (or R) can be used in combination with the leakage loss as discussed above to accurately determine an amount of available energy in the energy storage resource 125 that will be available to power the regulator circuitry 120-2 during a respective power failure condition.

Figure 11:
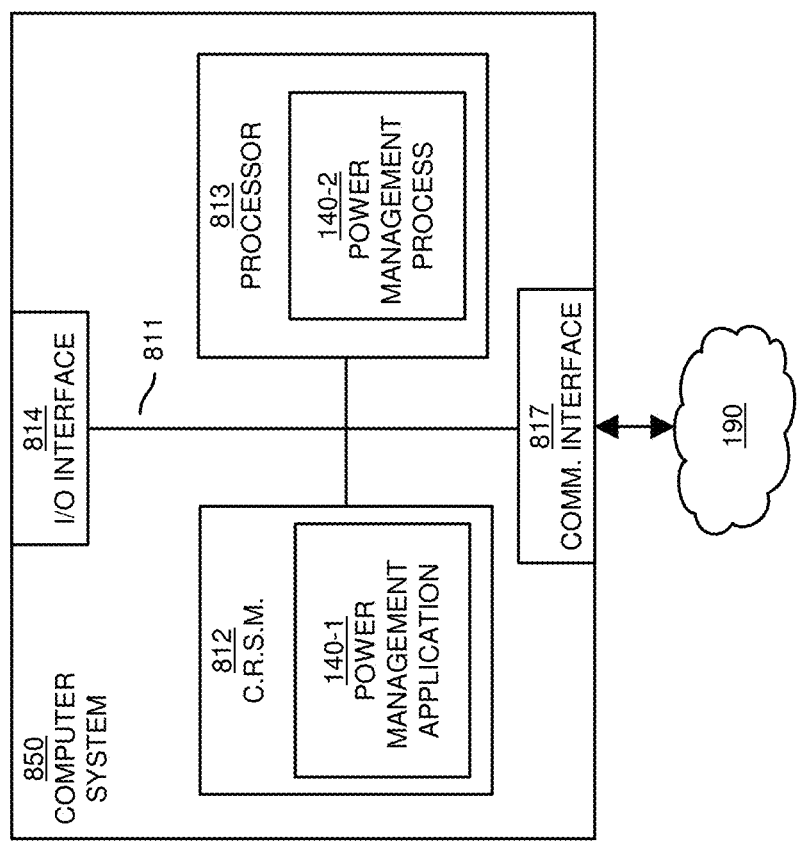
FIG. 11 is an example diagram illustrating a computer architecture that can be used to execute one or more methods according to embodiments herein.

FIG. 11 is an example block diagram of a computer system for implementing power management according to embodiments herein.

Computer system 850 can be configured to execute any of the operations with respect to power management application 140-1.

As shown, computer system 850 of the present example can include an interconnect 811 that couples computer readable storage media 812 such as a physical non-transitory type of media (i.e., any type of physical hardware storage medium) in which digital information can be stored and retrieved, a processor 813 (i.e., one or more processor devices or computer processor hardware), I/O interface 814, communications interface 817, etc.

Computer readable storage medium 812 can be any physical or tangible hardware storage device or devices such as memory, optical storage, hard drive, floppy disk, solid-state drive, etc. In one embodiment, the computer readable storage medium 812 (e.g., a computer readable hardware storage, non-transitory computer-readable media, etc.) stores instructions and/or data.

In one embodiment, communications interface 817 enables the computer system 850 and respective processor 813 (computer processor hardware) to communicate over a resource such as network 190 to retrieve information from remote sources and communicate with other computers. I/O interface 814 of computer system 850 enables the computer system 850 to receive feedback, produce output control signals to control switch 150-3 and/or load 118, etc., as previously discussed.

As shown, computer readable storage media 812 is encoded with power management application 140-1 (e.g., software, firmware, etc.) executed by processor 813. The power management application 140-1 can be configured to include instructions to implement any of the operations as discussed herein.

During operation of one embodiment, processor 813 accesses computer readable storage media 812 via the use of interconnect 811 in order to launch, run, execute, interpret or otherwise perform the instructions in power management application 140-1 stored on computer readable storage medium 812.

Execution of the power management application 140-1 produces processing functionality such as power management process 140-2 in processor 813. In other words, the power management process 140-2 associated with processor 813 represents one or more aspects of executing power management application 140-1 within or upon the processor 813 in the computer system 850.

Those skilled in the art will understand that the computer system 850 can include other processes and/or software and hardware components, such as an operating system that controls allocation and use of hardware resources, software resources, etc., to execute power management application 140-1.

In accordance with different embodiments, note that computer system 850 may be any of various types of devices, including, but not limited to, a mobile computer, a personal computer system, a wireless device, base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, or in general any type of computing or electronic device.

Functionality supported by the different resources will now be discussed via flowcharts in FIG. 12. Note that the processing in the flowcharts below can be executed in any suitable order.

Figure 12:
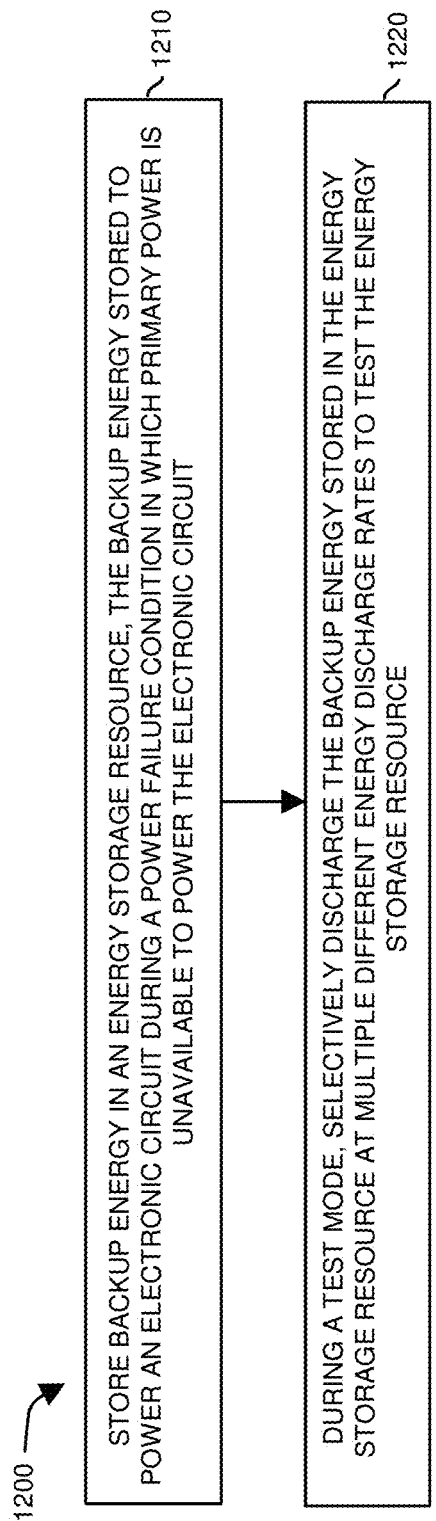
FIG. 12 is an example flowchart illustrating a method according to embodiments herein.

FIG. 12 is a flowchart 1200 illustrating an example method according to embodiments. Note that there will be some overlap with respect to concepts as discussed above.

In processing block 1210, the power management circuitry 140 initiates storage of backup energy in energy storage resource 125. The power management circuitry 140 stores the backup energy in the energy storage resource 125 to power an electronic circuitry 110 during a power failure condition in which primary power 105 (such as Vin) is unavailable to power the electronic circuitry 110.

In processing block 1210, during a test mode, the power management circuitry 140 selectively discharges the backup energy stored in the energy storage resource 125 at multiple different energy discharge rates to test the energy storage resource 125.

Figure 13:
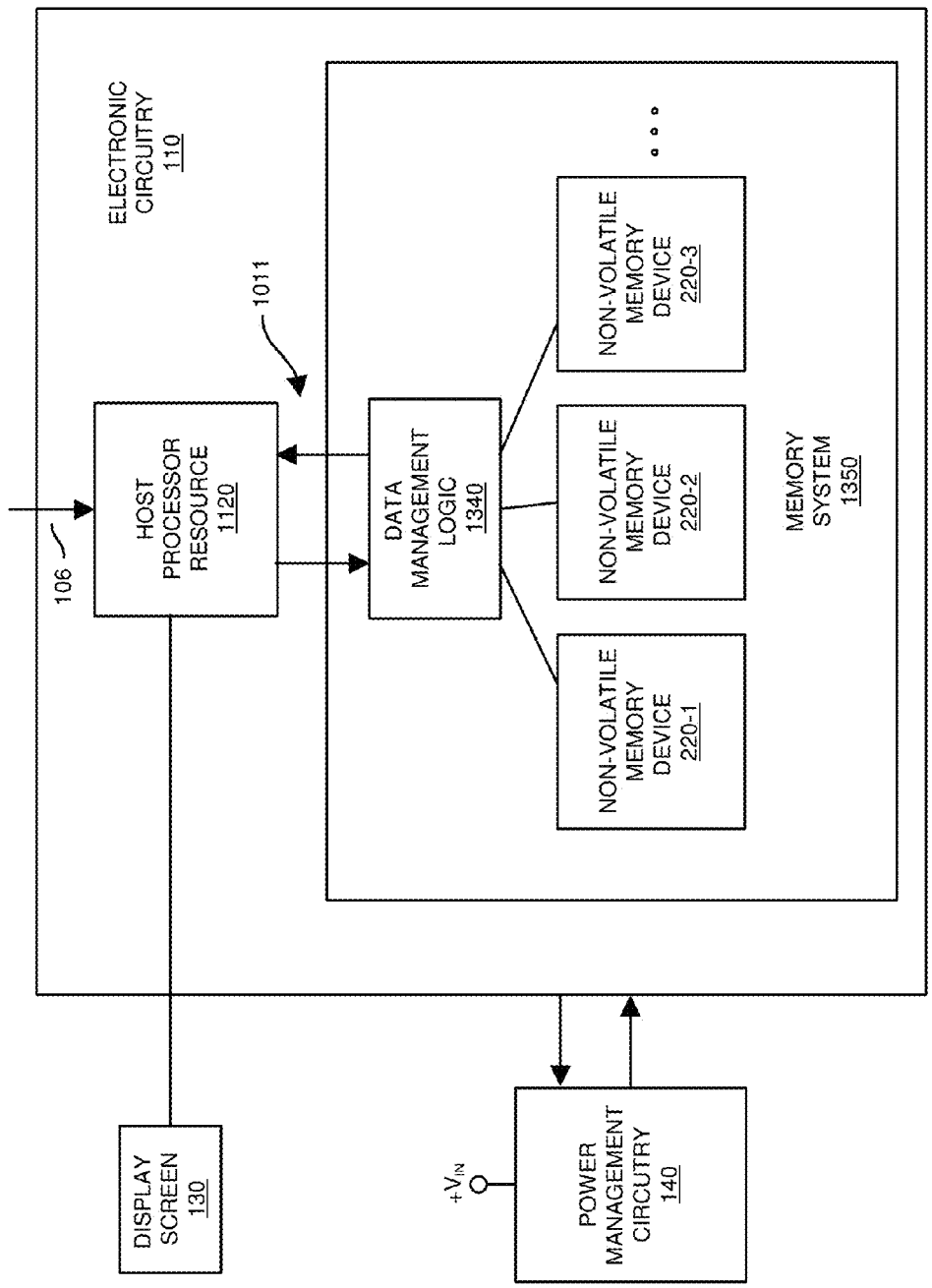
FIG. 13 is a diagram illustrating an example of electronic circuitry powered by power management circuitry according to embodiments herein.

FIG. 13 is an example diagram illustrating use of one or more assemblies in a respective computer system according to embodiments herein.

As shown, electronic circuitry 110 can include a host processor resource 1120 and memory system 1350. Host processor resource 1120 can be or include computer processor hardware such as one or more processor devices. By way of a non-limiting example, electronic circuitry 110 can be any suitable type of resource such as a personal computer, cellular phone, mobile device, camera, etc., using memory system 1350 to store data.

In one embodiment, memory system 1350 (such as a solid-state drive) includes one or more data storage devices such as non-volatile memory device 220-1, non-volatile memory device 220-2, non-volatile memory device 220-3, etc., to store respective data.

By further way of non-limiting example, the power management circuitry 140 can be integrated as part of the memory system 1350 for increased protection against loss of primary power 105. In such an instance, if the memory system 1350 represents a solid-state drive, then the capacitor charge test as described herein is performed in the solid-state drive.

Host processor resource 1120 has access to memory system 1350 via interface 1011. Interface 1011 can be any suitable link enabling data transfers. For example, the interface 1011 can be any suitable type of communication link supporting a transfer of data. By way of a non-limiting example, the communication link can be a SCSI (Small Computer System Interface), SAS (Serial Attached SCSI), SATA (Serial Advanced Technology Attachment), USB (Universal Serial Bus), PCIE (Peripheral Component Interconnect Express) bus, etc.

Via interface 1011, the host processor resource 1120 of electronic circuitry 110 is able to retrieve data from and store data in non-volatile memory devices 220 of memory system 1350.

As an example, assume that the host processor resource 1120 receives input 106 from a user to perform a respective function. Host processor resource 1120 executes the selected function, which can include transmitting a request over interface 1011 to data management logic 1340 for retrieval of data at a specified logical address. In addition to performing other functions, the data management logic 1340 can be configured to map the logical address of the received access request to an appropriate physical address in memory system 1350 and retrieve the data from one or more non-volatile memory devices 220. Subsequent to retrieving the appropriate data from memory system 1350, data management logic 1340 transmits the retrieved data to host processor resource 1120 satisfying the request for data.

In one non-limiting example embodiment, the host processor resource 1120 initiates display of an image on display screen 1030 depending on the data received from the data management logic 1040. In one embodiment, the electronic circuitry 110 includes display screen 130 on which to render an image based at least in part on corresponding data stored in the memory system 1350.

As a further example, note that the host processor resource 1120 can receive a request to perform a respective function as specified by input 106 from a user. Assume that the request from the user indicates to store data in the memory system 1350. In such an instance, host processor resource 1120 executes the function and communicates with data management logic 1340 to store received data at a specified logical address. In response to receiving the request, the data management logic 1340 maps the logical address of the write request to an appropriate physical address and stores the received data in a corresponding location in one or more of non-volatile memory devices 220.

As previously discussed, the primary power 105 provided by the input voltage Vin may experience a failure. That is, the input voltage Vin may drop below a threshold value. Power management circuitry 140 detects the loss of primary power 105 (Vin below a threshold value) and switches over to use of the backup energy stored in energy storage resource 125 such that data management logic 1140 is able to perform any required final reads and/or writes to the non-volatile memory devices 220.

As previously discussed, since the amount of backup energy stored in the energy storage resource 125 is limited, the data management logic 1340 may be required to perform final read and/or write operations prior to depletion of the backup energy stored in energy storage resource 125. In other words, after depletion of the backup energy stored in energy storage resource 125, the power management circuitry 140 no longer produces one or more output voltages 190 to power electronic circuitry 110. At such time, electronic circuitry 110 becomes unpowered and shuts OFF.

In one embodiment, computer processor hardware such as host processor resource 1120 or other suitable resource associated with electronic circuitry 110 controls operations or a configuration of the power management circuitry 140 to determine whether the energy storage resource 125 stores a sufficient amount of backup energy to power the electronic circuitry 110 during the power failure condition.

For example, the host processor resource 1120 can communicate the different load settings, threshold value settings (TV1, TV2, TV3, etc.) that are to be used during the different tests as discussed herein. The power management circuitry 140 can include a buffer to store the time values such as DELTA T1, DELTA T2, DELTA T3, and DELTA T4. In one embodiment, the host processor resource 1120 or other suitable resource associated with electronic circuitry 110 can be configured with the equations as discussed above to produce appropriate values and detect whether the energy storage resource 125 stores sufficient holdup energy.

The clock associated with one or more counters used by the test circuitry 135 may be quite inaccurate because the power management circuitry 140 operates off of an inaccurate clock. Note that further embodiments herein can include calibrating the clock associated with the power management circuit 140 such that the one or more of the calculated values as discussed herein are more accurate.

For example, to perform a calibration test with respect to one or more counters associated with test circuitry 135, the host processor resource 1120 (such as a computer processor hardware) can be configured to control (start and stop) a respective counter in power management circuit 140 while the host processor resource 1120 keeps track of time using its own clock, which is very accurate. More specifically, the host processor resource 1120 can be configured to communicate with the power management circuitry 140 via any suitable communication link and respective protocol such as via IIC (Inter-Integrated Circuit), SMB (System Management Bus), etc., to start and stop a respective counter in the power management circuitry 140. The power management circuitry 140 makes the elapsed time available to be host processor resource 1120. The host processor resource 1120 keeps track of elapsed time between the start and stop commands using a very accurate clock. The host processor resource 1120 can then produce a time correction factor that is to be applied to count values (such as DELTA T1, DELTA T2, DELTA T3, and DELTA T4). For example, if the counter in the test circuitry 135 indicates that a count of 110 between the start and stop commands, and the host processor resource 1120 detects that the actual elapsed time represents 100 milliseconds, the correction factor is 110/100=1.1. The host processor resource 1120 multiples any counter values such as for DELTA T1, DELTA T2, etc., by 1.1 to convert the count values to seconds. Accordingly a clock associated with the power management circuitry 140 can be calibrated with respect to a more accurate clock associated with the host processor resource 1120. In one embodiment, the host processor resource 1120 calibrates a clock associated with the power management circuitry 140 to produce the correction factor to more accurately measure the different energy discharge rates.

In accordance with yet further embodiments, note again that the host processor resource 1120 or other suitable resource can be configured to control operations of the power management circuitry 140 and/or test circuitry 135 to determine whether the energy storage resource 125 has a sufficient capacitance to store a sufficient amount of backup energy to power the electronic circuitry 110 during the power failure condition. If it is detected during a respective one or more tests that the energy storage resource 125 does not store sufficient energy to holdup energy applied to memory system 100 for a sufficient amount of time for data management logic 1140 to perform critical final writes of data to respective non-volatile memory devices 220, the host processor resource 1120 can be configured to initiate display of corresponding notification on display screen 130 for viewing by a respective user. Accordingly, the user can be proactive about replacing a failed bank of capacitors or replacing a respective solid-state drive device including the failed bank of capacitors.

Note further that any of the resources as discussed herein can include one or more computerized devices, computer systems, servers, base stations, wireless communication equipment, communication management systems, workstations, handheld or laptop computers, etc., to carry out and/or support any or all of the method operations disclosed herein. In other words, one or more computerized devices or processors can be programmed and/or configured to operate as explained herein to carry out different embodiments.

Additionally, note that although each of the different features, techniques, configurations, etc., herein may be discussed in different places of this disclosure, it is intended, where suitable, that each of the concepts can optionally be executed independently of each other or in combination with each other. Any permutation of the disclosed features is possible. Accordingly, the one or more embodiments as described herein can be embodied and viewed in many different ways.

Note further that techniques herein are well suited for use in monitoring attributes of an energy storage resource. However, it should be noted that embodiments herein are not limited to use in such applications and that the techniques discussed herein are well suited for other applications as well.

While details have been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the embodiments herein are presented in the following claims.

The invention claimed is:

1. An apparatus comprising:
   an energy storage resource operative to store backup energy to power electronic circuitry; and
   power management circuitry in communication with the energy storage resource, the power management circuitry being operative, during a test mode:
      to discharge the backup energy stored in the energy storage resource through a first load at a first energy discharge rate to obtain a first characteristic of the energy storage resource;
      to discharge the backup energy stored in the energy storage resource at a second energy discharge rate to obtain a second characteristic of the energy storage resource;
      to determine at least a third characteristic of the energy storage resource based at least on the first characteristic and the second characteristic; and
   based at least in part on the third characteristic of the energy storage resource, to determine an available amount of energy in the energy storage resource to power the electronic circuitry during a power failure condition.

2. The apparatus as in claim 1, wherein the energy storage resource is a bank of at least one capacitor to store the backup energy; and
   wherein the power management circuitry discharges the backup energy at different energy discharge rates during the test mode to calculate a capacity of the backup energy in the energy storage resource that is available to power the electronic circuitry during the power failure condition in which primary power is unavailable to power the electronic circuitry.

3. The apparatus as in claim 1, wherein the power management circuitry discharges the backup energy in the energy storage resource at different energy discharge rates during the test mode to identify a leakage current associated with the energy storage resource, the leakage current representing an amount of current that is consumed but that is unavailable to support holdup of the electronic circuitry during the power failure condition.

4. The apparatus as in claim 1, wherein the power management circuitry discharges the backup energy in the energy storage resource at different energy discharge rates to identify an equivalent series resistance associated with the energy storage resource.

5. The apparatus as in claim 1 further comprising:
   power loss detector circuitry to monitor a primary voltage source used to power the electronic circuitry, the power loss detector circuitry terminating discharge of the backup energy from the energy storage resource in response to detecting occurrence of the power failure condition.

6. The apparatus as in claim 1, wherein the power management circuitry prevents discharge of the backup energy stored in the energy storage resource below a threshold value during the test mode to ensure that a sufficient amount of the backup energy is available in the energy storage resource to power the electronic circuitry if the power failure condition occurs during the test mode.

7. The apparatus as in claim 1, wherein the power management circuitry is configured to:
   during a first discharge test of discharging backup energy in the energy storage resource at the first energy discharge rate:
      produce a first elapsed time value, the first elapsed time value representing an amount of time that a respective voltage magnitude of the energy storage resource falls from a first threshold voltage value to a second threshold voltage value; and
   during a second discharge test of discharging backup energy in the energy storage resource at the second energy discharge rate:
      produce a second elapsed time value, the second elapsed time value representing an amount of time that the respective voltage magnitude of the energy storage resource falls from the first threshold voltage value to the second threshold voltage value.

8. The apparatus as in claim 7, wherein the power management circuitry is configured to:
   utilize the first elapsed time value and the second elapsed time value to estimate an amount of the backup energy stored in the energy storage resource that is available to power the electronic circuitry during the power failure condition.

9. A computer system including the apparatus in claim 1, the computer system further comprising:
   computer processor hardware, the computer processor hardware controlling operations of the power management circuitry to determine whether the energy storage resource stores a sufficient amount of backup energy to power the electronic circuitry during the power failure condition.

10. The computer system as in claim 9, wherein the computer processor hardware calibrates a clock associated with the power management circuitry to more accurately measure the different energy discharge rates.

11. A method comprising:
    storing backup energy in an energy storage resource for powering electronic circuitry; and during a test mode:
discharging the backup energy stored in the energy storage resource through a first load at a first energy discharge rate to obtain a first characteristic of the energy storage resource;
discharging the backup energy stored in the energy storage resource at a second energy discharge rate to obtain a second characteristic of the energy storage resource;
determining at least a third characteristic of the energy storage resource based at least on the first characteristic and the second characteristic; and
based at least in part on the third characteristic of the energy storage resource, determining an available amount of energy in the energy storage resource to power the electronic circuitry during a power failure condition.

12. The method as in claim 11 further comprising:
monitoring discharge of the backup energy stored in the energy storage resource at different energy discharge rates to identify a leakage current associated with the energy storage resource, the leakage current consumed but unavailable to support holdup of electronic circuitry during occurrence of the power failure condition; and
based at least in part on the leakage current, calculating the available amount of energy in the energy storage resource for powering the electronic circuitry during the power failure condition.

13. The method as in claim 11 further comprising:
monitoring discharge of the backup energy stored in the energy storage resource at the different energy discharge rates to calculate a series resistance of the energy storage resource.

14. The method as in claim 11 further comprising:
monitoring discharge of the backup energy from the energy storage resource at the different energy discharge rates; and
based on monitoring the discharge at the different energy discharge rates, calculating an equivalent series resistance of the energy storage resource.

15. The method as in claim 11 further comprising:
in response to detecting occurrence of the failure condition during the test mode in which the backup energy is discharged from the energy storage resource, terminating discharge of the backup energy stored in the energy storage resource.

16. The method as in claim 11 further comprising:
during the test mode, discharging the backup energy stored in the energy storage resource to an auxiliary load with respect to the electronic circuit;
monitoring a primary voltage used to power electronic circuitry during the test mode; and in response to detecting occurrence of the power failure condition with respect to the primary voltage:
i) terminating discharge of a holdup energy from the energy storage resource to the auxiliary load, and
ii) utilizing the backup energy in the energy storage resource to power the electronic circuit.

17. The method as in claim 11, further comprising:
during a first discharge test of discharging backup energy in the energy storage resource at the first energy discharge rate:
producing a first elapsed time value, the first elapsed time value representing an amount of time that a respective voltage magnitude of the energy storage resource falls from a first threshold voltage value to a second threshold voltage value; and
during a second discharge test of discharging backup energy in the energy storage resource at the second energy discharge rate:
producing a second elapsed time value, the second elapsed time value representing an amount of time that the respective voltage magnitude of the energy storage resource falls from the first threshold voltage value to the second threshold voltage value.

18. The method as in claim 17 further comprising:
utilizing the first elapsed time value and the second elapsed time value to estimate an amount of the backup energy stored in the energy storage resource that is available to power electronic circuitry during the power failure condition.

19. The method as in claim 18 further comprising:
electrically isolating the energy storage resource from a load to discharge the energy storage resource at the first energy discharge rate, the first energy discharge rate representing a leakage discharge associated with the energy storage resource; and
electrically coupling the energy storage resource to a load to discharge the energy storage resource at the second energy discharge rate, the second energy discharge rate representing a sum of the leakage discharge and discharge of energy to the load.

20. The method as in claim 17 further comprising:
utilizing the first elapsed time value and the second elapsed time value to calculate an equivalent series resistance associated with the energy storage resource.

21. The method as in claim 17 further comprising:
producing a value representative of an amount of energy in the energy storage resource available to power electronic circuitry during the power failure condition;
comparing the produced value to an energy threshold value; and
in response to detecting that the produced value is less than the energy threshold value, producing status information indicating that the energy storage resource does not store sufficient energy to power electronic circuitry during the power failure condition.

22. Computer-readable storage hardware having instructions stored thereon, the instructions, when carried out by computer processor hardware, causing the computer processor hardware to perform operations of:
storing backup energy in an energy storage resource for powering electronic circuitry; and
during a test mode:
discharging the backup energy stored in the energy storage resource through a first load at a first energy discharge rate to obtain a first characteristic of the energy storage resource;
discharging the backup energy stored in the energy storage resource at a second energy discharge rate to obtain a second characteristic of the energy storage resource;
determining at least a third characteristic of the energy storage resource based at least on the first characteristic and the second characteristic; and
based at least in part on the third characteristic of the energy storage resource, determining an available amount of energy in the energy storage resource to power the electronic circuitry during a power failure condition.

23. The computer readable storage hardware as in claim 22, wherein the instructions, when carried out by the computer processor hardware, cause the computer processor hardware to perform operations of:

monitoring discharge of the backup energy stored in the energy storage resource at different energy discharge rates to identify a leakage current associated with the energy storage resource, the leakage current unavailable to support holdup of electronic circuitry during occurrence of the power failure condition.

24. The apparatus of claim 1 wherein the energy storage resource has an associated leakage current, wherein the first load is operative to draw a first predetermined output current from the energy storage resource, and wherein the first characteristic of the energy storage resource corresponds to a sum of the first predetermined output current and the leakage current.

25. The apparatus of claim 24 wherein the second characteristic of the energy storage resource corresponds to the leakage current associated with the energy storage resource.

26. The apparatus of claim 25 wherein the power management circuitry is further operative to determine at least the third characteristic of the energy storage resource based at least on the leakage current and the sum of the first predetermined output current and the leakage current, the third characteristic of the energy storage resource corresponding to a capacitance of the energy storage resource.

27. The apparatus of claim 26 wherein the power management circuitry is further operative to determine a fourth characteristic of the energy storage resource based at least on the capacitance of the energy storage resource, the first predetermined output current, and the sum of the first predetermined output current and the leakage current, the fourth characteristic of the energy storage resource corresponding to an effective capacitance of the energy storage resource taking into account the leakage current associated with the energy storage resource.

28. The apparatus of claim 1 wherein the power management circuitry is further operative to discharge the backup energy stored in the energy storage resource through a second load at the second energy discharge rate to obtain the second characteristic of the energy storage resource.

29. The apparatus of claim 28 wherein the first load is operative to draw a first predetermined output current from the energy storage resource, and wherein the second load is operative to draw a second predetermined output current from the energy storage resource, the second predetermined output current being different from the first predetermined output current.

30. The apparatus of claim 29 wherein the energy storage resource has an associated equivalent series resistance, wherein the energy storage resource has an associated full-charge voltage, and wherein the first characteristic of the energy storage resource corresponds to a first voltage difference between the full-charge voltage and a product of the first predetermined output current and the equivalent series resistance.

31. The apparatus of claim 30 wherein the second characteristic of the energy storage resource corresponds to a second voltage difference between the full-charge voltage and a product of the second predetermined output current and the equivalent series resistance.

32. The apparatus of claim 31 wherein the power management circuitry is further operative to determine at least the third characteristic of the energy storage resource based at least on the first voltage difference and the second voltage difference, the third characteristic corresponding to the equivalent series resistance associated with the energy storage resource.

* * * * *